United States Patent
McCrea et al.

(10) Patent No.: US 7,486,420 B2
(45) Date of Patent: *Feb. 3, 2009

(54) FLEXOGRAPHIC PRINTING

(75) Inventors: Devon James McCrea, Burnaby (CA); Stephen Hughes Miller, Silver Spring, MD (US)

(73) Assignee: Kodak Graphic Communications Canada Company, Burnaby, British Columbia (CA)

( * ) Notice: Subject to any disclaimer, the term of this patent is extended or adjusted under 35 U.S.C. 154(b) by 117 days.

This patent is subject to a terminal disclaimer.

(21) Appl. No.: 11/611,178

(22) Filed: Dec. 15, 2006

(65) Prior Publication Data

US 2007/0081194 A1 Apr. 12, 2007

Related U.S. Application Data

(60) Division of application No. 11/233,943, filed on Sep. 23, 2005, now Pat. No. 7,245,402, which is a continuation-in-part of application No. 10/736,216, filed on Dec. 15, 2003, now Pat. No. 7,126,724.

(60) Provisional application No. 60/453,544, filed on Mar. 12, 2003.

(30) Foreign Application Priority Data

Mar. 11, 2003 (CA) .................................. 2422132

(51) Int. Cl.
*H04N 1/405* (2006.01)
*B41C 1/00* (2006.01)

(52) U.S. Cl. ...................... 358/3.3; 358/3.13; 358/3.09; 358/3.21

(58) Field of Classification Search .................. 358/1.9, 358/2.1, 3.06, 3.13, 3.14, 3.17, 3.21, 3.26, 358/3.29, 3.3, 536–536, 3.02, 3.1, 3.09, 3.12; 101/401, 401.1; 430/306
See application file for complete search history.

(56) References Cited

U.S. PATENT DOCUMENTS

| 4,101,324 A | 7/1978 | Mizuno et al. |
|---|---|---|
| 4,610,950 A | 9/1986 | Milliken |
| 4,927,723 A | 5/1990 | Cusdin |
| 5,813,342 A | 9/1998 | Strong |

(Continued)

FOREIGN PATENT DOCUMENTS

EP 0 361 515 6/1995

(Continued)

OTHER PUBLICATIONS

HyperFlex Plate Resolution Enhancement, Label Expo 2004, Session 21: Sep. 16, High Definition Label Printing: Quality and Performance Breakthroughs in Flexography—by Creo.

*Primary Examiner*—Scott A Rogers
(74) *Attorney, Agent, or Firm*—Nelson Adrian Blish

(57) ABSTRACT

A method of screening a continuous tone image into a halftone representation for a flexographic printing operation can compensate for characteristic printing problems in highlight areas by selectively placing non-printing dots or pixels proximate highlight dots. The non-printing dots or pixels raise the printing relief floor in the highlight areas providing additional support for marginally printable image features.

23 Claims, 13 Drawing Sheets

U.S. PATENT DOCUMENTS

| | | |
|---|---|---|
| 6,406,833 B1 | 6/2002 | Nouel |
| 6,515,768 B1 | 2/2003 | Deschuytere et al. |
| 2002/0083855 A1 | 7/2002 | Samworth |
| 2003/0043414 A1 | 3/2003 | Brady |
| 2003/0048477 A1 | 3/2003 | Russell |
| 2003/0084803 A1 | 5/2003 | Gross |
| 2004/0130753 A1 | 7/2004 | Crounse |
| 2005/0157347 A1 | 7/2005 | Dewitte |

FOREIGN PATENT DOCUMENTS

| | | |
|---|---|---|
| EP | 1 505 654 | 2/2005 |
| EP | 1 612 581 | 1/2006 |
| WO | 02/085625 A1 | 10/2002 |

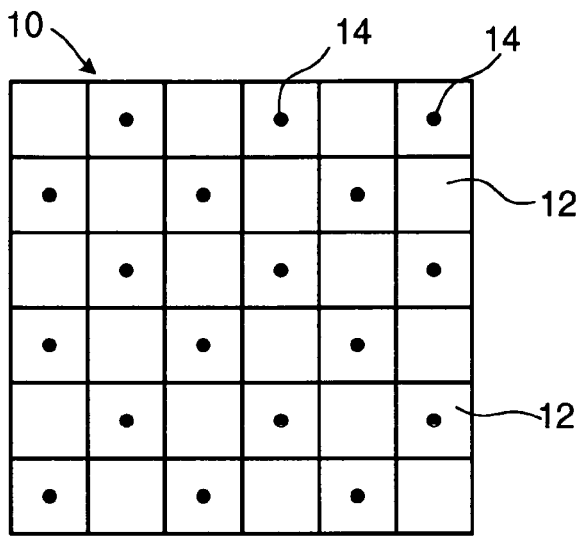
FIG. 1-A
Prior Art
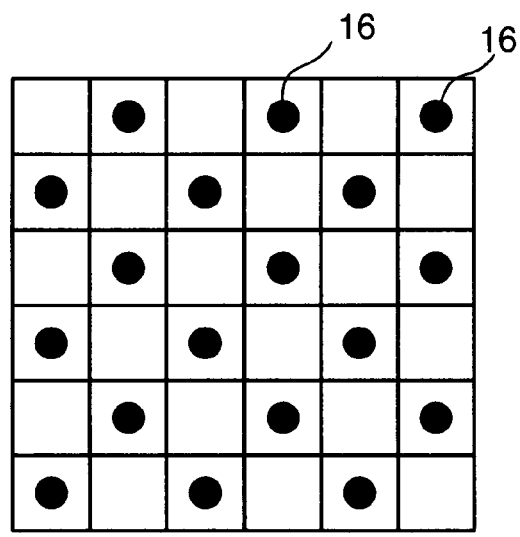
FIG. 1-B
Prior Art
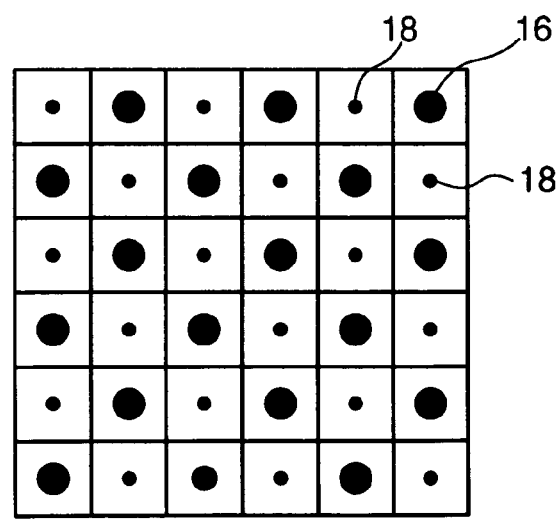
FIG. 1-C
Prior Art

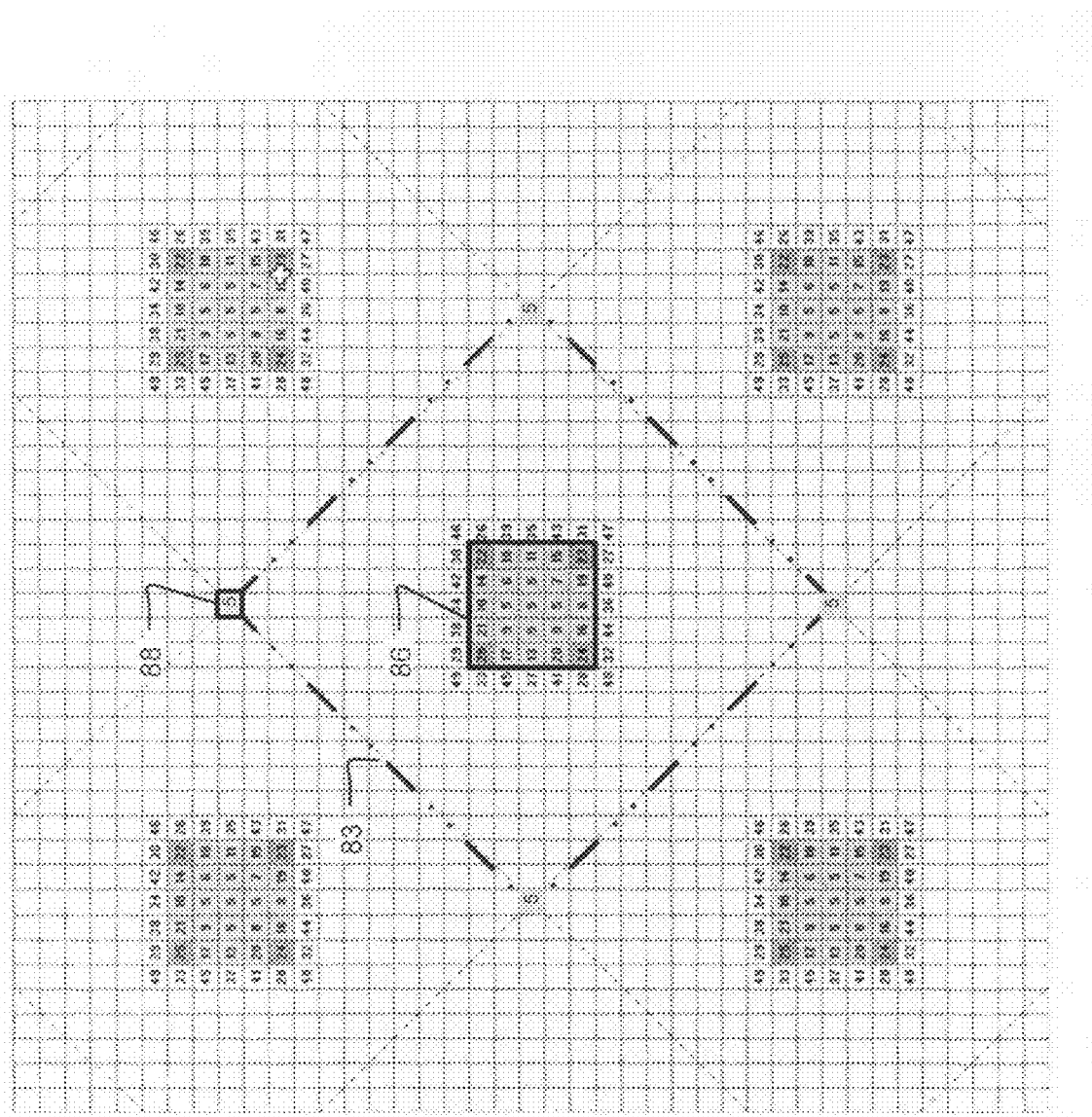

FLEXOGRAPHIC PRINTING

CROSS REFERENCE TO RELATED APPLICATIONS

This application is a Divisional of U.S. Ser. No. 11/233,943 filed Sep. 23, 2005 now U.S. Pat. No. 7,245,402, which is a Continuation-in-Part of U.S. application Ser. No. 10/736,216 filed Dec. 15, 2003 now U.S. Pat. No. 7,126,724, which claims the benefit of U.S. Provisional Application No. 60/453,544, filed Mar. 12, 2003, and claims priority to Canadian Application No. 2,422,132, filed Mar. 11, 2003. All of these applications are herein incorporated by reference.

TECHNICAL FIELD

The invention relates to the field of flexographic printing and more particularly to screening methods for representing an image on a flexographic plate.

BACKGROUND

Flexographic printing is a method of direct rotary printing that uses a resilient relief image in a plate of rubber or photopolymer to print articles such as cartons, bags, labels or books. Flexographic printing has found particular application in packaging, where it has displaced rotogravure and offset lithography printing techniques in many cases. While the quality of articles printed using flexographic plates has improved significantly as the technology has matured, physical limitations related to the process of creating a relief image in a plate remain.

In particular, it is very difficult to print small graphic elements such as fine dots, lines and even text using flexographic printing plates. In the lightest areas of the image (commonly referred to as highlights) the density of the image is represented by the total area of dots in a halftone screen representation of a continuous tone image. For Amplitude Modulated (AM) screening, this involves shrinking a plurality of halftone dots located on a fixed periodic grid to a very small size, the density of the highlight being represented by the area of the dots. For Frequency Modulated (FM) screening, the size of the halftone dots is generally maintained at some fixed value, and the number of randomly or pseudo-randomly placed dots represent the density of the image. In both the aforementioned cases, it is necessary to print very small dot sizes to adequately represent the highlight areas.

Maintaining small dots on a flexographic plate is very difficult due to the nature of the plate making process. Digital flexographic plate precursors have an integral UV-opaque mask layer coated over the photopolymer. In a pre-imaging (or post-imaging) step the floor of the plate is set by area exposure to UV light from the back of the plate. This exposure hardens the photopolymer to the relief depth required for optimal printing. This step is followed by selective ablation of the mask layer with an imagewise addressable high power laser to form an image mask that is opaque to ultraviolet (UV) light in non-ablated areas. Flood exposure to image-forming UV radiation and chemical processing follow wherein the areas not exposed to UV are removed in a processing apparatus using solvents or by a heating and wicking process. The combination of the mask and UV exposure produces relief dots that have a generally conical shape. The smallest of these dots are prone to being removed during processing, which means no ink is transferred to these areas during printing (the dot is not "held" or formed on plate and/or on press). Alternatively, if the dot survives processing they are susceptible to damage on press. For example small dots often fold over and/or partially break off during printing causing either excess ink or no ink to be transferred.

Conventional or non-digital flexographic platemaking follows a similar process except that the integral mask is replaced by a separate film mask or phototool that is imaged separately and placed in contact with the photopolymer plate precursor under a vacuum frame for the image-forming UV exposure.

In printing, it is well known that there is a limit to the minimum size of halftone dot that may be reliably represented on a plate and subsequently printed on press. The actual minimum size will vary with a variety of factors including plate type, ink, imaging device characteristics etc. This creates a problem in the highlight areas when using conventional AM screening since once the minimum dot size is reached, further size reductions will generally have unpredictable results. If, for example, the minimum size dot that can be printed is a 50×50 µm square dot, corresponding to a 5% tone at 114 lines per inch screen frequency, then it becomes very difficult to faithfully reproduce tones between 0% and 5%. A common workaround is to increase the highlight values in the original file to ensure that after imaging and processing, that all the tonal values in the file are reproduced as printing dots and are properly formed on the plate. However, the downside to this practice is the additional dot gain in the highlights, which causes a noticeable transition between inked and non-inked areas. Another well-known practical way of improving highlights is through the use of "Respi" or "double dot" screening. One such technique is shown in FIG'S. 1-A to 1-C. A screening grid 10 for conventional AM screen is shown in a simplified schematic format. The screening grid comprises a plurality of halftone cells 12. A halftone cell is an area wherein an AM halftone dot is grown from a low density, where only a small dot is placed at the centre of the cell, to a high density or solid where the cell is completely filled. In FIG. 1-A, dots 14 are placed only in every second halftone cell. Dots 14 have size corresponding to the minimum reliably reproducible dot. As the density of the screen is increased, dots 14 are increased in size as shown in FIG. 1-B at 16. At some point in increasing the density, the previously empty halftone cells are populated with minimum size dots 18 as shown in FIG. 1-C. The dots 16 may be held at a fixed size with increasing screen density while allowing dots 18 to grow. When all dots are the same size as dots 16, conventional AM screening takes over.

The problem with this type of screening technique when applied to flexographic printing is that the size of dot that may be printed in isolation is actually quite large, typically 40-50 µm in diameter. Even when using this technique, the highlights are difficult to reproduce without having a grainy appearance (which occurs when dots are spaced far apart to represent a very low density) and the printed dot may also suffer an undesirable dot gain.

There remains a need to improve the representation of small dots in flexographic printing processes.

SUMMARY OF THE INVENTION

The invention provides a flexographic screening technique that allows an image feature to be surrounded by one or more smaller non-printing features to provide an extra base of support for the image feature.

In one general aspect, the invention features a method for preparing a halftone representation of an image for use in making a flexographic printing plate. This method includes identifying at least one printable image feature in the halftone representation to be used in making the flexographic plate according to at least one predetermined decision criterion, and establishing at least one non-printing image feature proximate to the identified printable image feature.

In preferred embodiments, the step of establishing can be operative to establish one or more non-printing dots as the non-printing image feature. The non-printing dots provide additional localized exposure of the printing medium to effectively raise the relief floor proximate a printable image feature. The step of identifying can be operative to identify marginally printable image features that are too small to be reliably printed as the identified printable image features. The step of identifying can include establishing a minimum size of image feature that is reliably printable as the at least one decision criterion. The step of identifying can include locating in the halftone representation, image features that are smaller than the minimum size. The step of identifying can include locating in the image, image features that are smaller than the minimum size. The image feature can be a dot, with the minimum size corresponding to a minimum reliably printable dot area. The image feature can be a line, with the minimum size corresponding to a minimum reliably printable line thickness. The method can further include screening a continuous tone image to create the halftone representation. The step of establishing at least one non-printing image feature can include adding a non-printing dot to the halftone representation. The halftone representation can be an amplitude-modulated screen representation of the continuous tone image. The halftone representation can be a frequency-modulated screen representation of the continuous tone image. The step of screening can include comparing the image to a threshold array on a pixel-by-pixel basis. The method can further include exposing the flexographic printing plate to image-forming radiation in accordance with the halftone representation. The step of exposing the flexographic plate to image-forming radiation can include preparing a film mask in accordance with the halftone image representation, and exposing the flexographic printing plate to image-forming radiation through the film mask. Alternatively, image-wise exposure of the plate using a focused radiation source, such as a laser or other means of producing a switchable focused beam of radiation with the appropriate resolution. The identifying step and the establishing step can be performed in a single operation. The method can further include removing sub-marginally printable image features from the halftone image representation. The step of establishing can be operative to establish non-printing dots as the non-printing image features, with the non-printing dots being no larger in area than 2500 μm2.

In another general aspect, the invention features a method for preparing a flexographic printing plate, which includes establishing a relief floor, by back-exposing the flexographic printing plate or by other means, and receiving halftone image data representing an image to be printed. The halftone image data defines a plurality of printable image features, at least one nonprinting area proximate at least one of the printable image features, and at least one non-printing background area, The flexographic printing plate is exposed in accordance with the halftone image data, and processed to develop a relief image.

In a further general aspect, the invention features a flexographic printing plate that includes a non ink-transferring background area and an ink-transferring surface defined in relief to the background area and formed in accordance with an image to be printed. The ink-transferring surface has printable image features, and at least one non-printing feature is disposed proximate to at least one of the printable image features. In preferred embodiments, the non-printing features can include a plurality of non-printing dots disposed around a periphery of at least one marginally printable image feature.

In another general aspect, the invention features an apparatus for preparing an image for use in making a flexographic printing plate. This apparatus includes a workstation for receiving image data representing an image, a raster image processor for converting the image into a halftone representation thereof, and an image processor for identifying at least one printable image feature and establishing at least one non-printing image feature in proximity to the printable image feature. In preferred embodiments, the image processor can have a memory for storing the halftone representation once the non-printing image features have been established. In preferred embodiments, the image processor controls the operation of the raster image processor.

In another general aspect, the invention features an apparatus for preparing an image for use in making a flexographic printing plate, which includes printable image feature identification logic operative to identify at least one printable image feature in a halftone representation to be used in making a flexographic printing plate according to at least one predetermined decision criterion, and non-printing image feature establishment logic responsive to the printable image feature identification logic and operative to establish at least one non-printing feature proximate to the printable image feature identified by the printable image feature identification logic.

In a further general aspect, the invention features an apparatus for preparing an image for use in making a flexographic printing plate, which includes means for identifying at least one printable image feature in a halftone representation to be used in making a flexographic printing plate according to at least one predetermined decision criterion, and means responsive to the printable image feature identification logic for establishing at least one non-printing feature proximate to the printable image feature identified by the means for identifying.

In another general aspect, the invention features a memory for storing data for access by a flexographic printing system, with the memory including machine-readable data elements adapted to specify to the flexographic printing system at least one printable image feature, at least one non-printing feature proximate the printable image feature, and at least one non ink-transferring background area. In preferred embodiments, the machine-readable data elements can include data elements operative to specify the non-printing feature as one or more non-printing dots.

In a further general aspect, the invention features a system for preparing an image for use in making a flexographic printing plate that includes printable image feature identification logic operative to identify at least one printable image feature in a halftone representation to be used in making a flexographic plate according to at least one predetermined decision criterion, and non-printing image feature establishment logic responsive to the printable image feature identification logic and operative to establish at least one non-printing feature proximate to the printable image feature identified by the printable image feature identification logic.

In another general aspect, the invention features a system for preparing an image for use in making a flexographic printing plate that includes means for identifying at least one printable image feature in a halftone representation to be used in making a flexographic plate according to at least one predetermined decision criterion, and means responsive to the printable image feature identification logic for establishing at least one non-printing feature proximate to the printable image feature identified by the means for identifying.

In a further general aspect, the invention features a memory for storing data for access by a flexographic printing system, wherein the memory comprises machine-readable data elements adapted to specify to the flexographic printing system at least one printable image feature, at least one non-printing feature proximate the printable image feature, and at least one non ink-transferring background area.

In preferred embodiments, the machine-readable data elements can include data elements operative to specify the at least one non-printing feature as one or more non-printing dots.

In another general aspect, the invention features a system for preparing an image for use in making a flexographic printing plate that includes a computer system for receiving image data and a raster image processor for converting the image data into halftone data for producing a relief image in the flexographic printing plate. The raster image processor includes a halftone generator for creating a marginal halftone dot for a highlight feature of the image data wherein the marginal halftone dot tends to produce a marginally printable relief dot in the flexographic printing plate medium, and adding a non-printing configuration of halftone pixels in the halftone data, proximate to the marginal halftone dot, to improve the printability of the marginally printable relief dot, wherein the configuration of halftone pixels is based on a characteristic of the marginal halftone dot.

In preferred embodiments, the halftone generator can be operative to vary number of added pixels as the area of the created marginal halftone dot varies. The halftone generator can be operative to vary position of added pixels as the area of the created marginal halftone dot varies. The halftone generator can be operative to vary position of added pixels as the area of the created marginal halftone dot varies. The halftone generator can be operative to add the configuration of halftone pixels as a plurality of halftone pixel clusters in relation to the marginal halftone dot. The halftone generator can be operative to add a part of the configuration of halftone pixels to improve the printability of the marginally printable relief dot and at least one neighboring marginally printable relief dot. The at least one neighboring marginally printable relief dot can comprise a plurality of marginally printable relief dots corresponding to a plurality of marginal halftone dots, with the marginal halftone dot and the plurality of marginal halftone dots sharing a halftone cell corner. The halftone generator can include a plurality of threshold arrays for comparing with grayscale pixel values of the image data to produce corresponding halftone pixel values in the halftone data. The halftone generator can include a plurality of halftone tiles used to determine halftone pixels for the halftone data based on corresponding grayscale pixel values of the image data, with each halftone tile comprising a plurality of halftone pixel values for an area having a constant grayscale value.

In a further general aspect, the invention features a system for preparing an image for use in making a flexographic printing plate that includes a computer system for receiving image data and a raster image processor for converting the image data into halftone data for producing a relief image in the flexographic printing plate. Also included is an image processor for identifying a marginal halftone dot amongst the halftone data wherein the marginal halftone dot tends to produce a marginally printable relief dot in the flexographic printing plate, and enabling a configuration of non-printing halftone pixels in the halftone data, proximate to the marginal halftone dot, to improve the printability of the marginally printable relief dot, wherein the configuration of halftone pixels is based on a characteristic of the marginal halftone dot.

In another general aspect, the invention features a memory for storing data for access by a flexographic printing system that includes machine-readable data elements adapted to specify to the flexographic printing system a marginal halftone dot wherein the marginal halftone dot tends to produce a marginally printable relief dot in a flexographic printing plate, and a configuration of enabled halftone pixels, proximate to the marginal halftone dot, to improve the printability of the marginally printable relief dot, and wherein the configuration of halftone pixels is based on a characteristic of the marginal halftone dot.

In preferred embodiments, the data elements can comprise first data elements for specifying a first configuration of halftone pixels for a first marginal halftone dot of a first area and second data elements for specifying a second configuration of halftone pixels for a second marginal halftone dot of a second area, with the number of pixels of a configuration of enabled halftone pixels being different amongst the first and second data elements. The position of pixels of a configuration of enabled halftone pixels can be different amongst the first and second data elements.

In a further general aspect, the invention features a system for preparing an image for use in making a flexographic printing plate that includes means for generating halftone data used to produce a relief image in the flexographic printing plate. The means for generating halftone data comprises means for identifying a marginal halftone dot amongst the halftone data wherein a relief dot produced in the flexographic printing plate based on the marginal halftone dot tends to produce a marginally printable relief dot, and means for enabling a configuration of non-printing halftone pixels in the halftone data, proximate to the marginal halftone dot, to improve the printability of the marginally printable relief dot, wherein the configuration of halftone pixels is based on a characteristic of the marginal halftone dot.

In another general aspect, the invention features a system for preparing an image for use in making a flexographic printing plate that includes means for constructing a plurality of threshold arrays comprising means for constructing at least one threshold array defining a marginal halftone dot wherein the means for producing a relief dot in the flexographic printing plate based on the marginal halftone dot tends to produce a marginally printable relief dot, and means for comparing a plurality of gray scale values derived from the image data with the plurality of threshold arrays to generate a halftone data for means for producing a relief image in the flexographic printing plate.

In preferred embodiments, means for constructing the at least one threshold array defining a marginal halftone dot can comprise, for each threshold array, means for defining a configuration of halftone pixels, proximate to the marginal halftone dot, to improve the printability of the marginally printable relief dot. The means for constructing the plurality of threshold arrays can include means for identifying a usage range for each threshold array of the plurality of threshold arrays and with a usage range for a threshold array specifying the range of gray scale values that can be compared with the threshold array.

In a further general aspect, the invention features a system for producing a flexographic printing medium that includes means for establishing a relief medium floor as a base for a relief image and means for receiving halftone data representing the relief image. The halftone data includes a plurality of normal halftone dots wherein a normal halftone dot tends to produce a reliably printable relief dot, at least one marginal halftone dot wherein a marginal halftone dot tends to produce a marginally printable relief dot, and a configuration of halftone pixels, proximate to each at least one marginal halftone dot, wherein the configuration of halftone pixels improves the printability of the corresponding marginally printable relief dot, and wherein the configuration of halftone pixels is based on a characteristic of the marginal halftone dot. Also included are means for exposing the flexographic printing plate in accordance with the halftone data, and means for processing the flexographic printing plate to develop the relief image.

In preferred embodiments, the means for exposing the flexographic printing plate can comprise means for exposing with radiation filtered through an image-wise mask or means for exposing image-wise with focused radiation.

In another general aspect, the invention features a system for preparing an image for use in making a flexographic printing plate that includes logic for identifying two or more printable image features, and logic for establishing at least one shared non-printing image feature in proximity to the printable image features based on the location of the two printable image features. In preferred embodiments, the two printable image features can each be marginally printable halftone dots with the non-printing image feature being a shared pixel cluster.

In another general aspect, the invention features a method for processing image data to be printed by a relief printing medium onto a substrate that includes constructing threshold arrays comprising constructing at least one defining a marginal halftone dot, with a relief dot produced in the relief printing medium based on the marginal halftone dot tending to be a marginally printable relief dot. The method also includes comparing a plurality of gray scale values derived from the image data with the plurality of threshold arrays to generate a halftone data for producing a relief image in the relief printing medium.

In preferred embodiments, the step of constructing each threshold array defining a marginal halftone dot can comprise defining a configuration of halftone pixels, proximate to the marginal halftone dot, to improve the printability of the marginally printable relief dot. The step of defining the configuration of halftone pixels may not produce an additional relief dot corresponding to the configuration of halftone pixels. Constructing the plurality of threshold arrays can include identifying a usage range for each threshold array of the plurality of threshold arrays, with the usage range for the threshold array specifying a range of gray scale values that can be compared with the threshold array. Comparing the plurality of gray scale values derived from the image data with the plurality of threshold arrays to generate the halftone data can comprise, for a gray scale value: selecting a threshold array of the plurality of threshold arrays if the gray scale value is within the usage range of the threshold array, and comparing the gray scale value with a corresponding threshold value of the threshold array to produce a corresponding halftone pixel value in the halftone data. The step of identifying the usage range for each threshold array of the plurality of threshold arrays can comprise identifying a limit value corresponding to a largest constant gray scale image value that still produces a marginal halftone dot, identifying a count of the at least one threshold array, dividing a gray scale range, comprising a range of values between a minimum gray scale value and the limit value, by the count to form a plurality of substantially equal usage ranges for the at least one threshold array, and allocating a remaining range of gray scale values, comprising values larger than the limit value, to a remaining threshold array of the plurality of threshold arrays. Identifying the limit value can comprise a user specifying the limit value. Constructing the at least one threshold array defining a marginal halftone dot can also include, for each threshold array of the at least one threshold array, defining a portion of the marginal halftone dot based on the usage range of the threshold array. The step of defining a first portion of the marginal halftone dot in a first threshold array can also include defining, in the first threshold array, a second portion of the marginal halftone dot defined in a second threshold array if values of the usage range of the first threshold array are greater than values of the usage range of the second threshold array. Defining the portion of the marginal halftone dot based on the usage range of the threshold array can comprise defining a plurality of halftone pixels for the portion of the marginal halftone dot. Defining the plurality of halftone pixels for the portion of the marginal halftone dot can comprise defining a corresponding plurality of threshold values with the plurality of threshold values comprising values within the usage range of the threshold array. Defining the configuration of halftone pixels, proximate to the marginal halftone dot, can comprise defining a corresponding configuration of threshold values. Defining the configuration of threshold values can comprise defining each threshold value as a minimum value of the plurality of threshold values of the portion of the marginal halftone dot defined by the threshold array. Defining the configuration of halftone pixels, proximate to the marginal halftone dot, can also include determining a number of halftone pixels for the configuration, and arranging the number of halftone pixels in relation to the marginal halftone dot. Determining the number of halftone pixels can comprise determining based on a characteristic of the marginal halftone dot and the threshold array. Determining based on the characteristic of the marginal halftone dot and the threshold array can comprise: determining a maximum halftone dot area of the marginal halftone dot defined by the threshold array, obtaining data describing a number of halftone pixels based on a halftone dot area, and determining the number of halftone pixels from the data based on the maximum halftone dot area. Determining a halftone dot area of a marginal halftone dot defined by a threshold array can comprise determining an area occupied by a plurality of halftone pixels of the marginal halftone dot enabled by comparing the threshold array with a constant gray scale value with the value comprising a value within the usage range of the threshold array. The data describing a number of halftone pixels based on a halftone dot area can comprise: a maximum number of halftone pixels for a minimum halftone dot area, and a reduced number of halftone pixels for a larger halftone dot area. The data describing a number of halftone pixels based on a halftone dot area can be specified by a user. Arranging the number of halftone pixels in relation to the marginal halftone dot can comprise: forming a plurality of halftone pixel clusters from the number of halftone pixels, and arranging the plurality of halftone pixels clusters in relation to the marginal halftone dot. A halftone pixel cluster of the plurality of halftone pixel clusters can comprise at least one halftone pixel arranged in a pattern. The at least one halftone pixel arranged in a pattern can comprise a characteristic, with a value of the characteristic for the at least one halftone pixel cluster being less than a minimum value required to form a relief dot. The characteristic can comprise an area occupied by the at least one halftone pixel arranged in a pattern. The at least one halftone pixel can be arranged in a pattern comprises pixels arranged adjacently around a centre location. The at least one halftone pixel can be arranged in a pattern that comprises pixels arranged in a dispersed fashion around a centre location. The at least one halftone pixel can be arranged in a pattern comprises pixels arranged in a pattern specified by a user. Forming the plurality of halftone pixel clusters from the number of halftone pixels can comprise: determining a number of halftone pixel clusters, and allocating the number of halftone pixels amongst the number of halftone pixel clusters. Determining the number of halftone pixel clusters is based on a halftone geometry of the halftone data. Determining the number of halftone pixel clusters is predetermined to be four halftone pixel clusters for a trapezoidal halftone cell geometry. Allocating the number of halftone pixels amongst the number of halftone pixel clusters can comprise allocating the number of halftone pixels substantially equally amongst the number of halftone pixel clusters. Arranging the plurality of halftone pixels clusters in relation to the marginal halftone dot can comprise arranging the plurality of halftone pixel clusters with a substantially homogeneous distribution around the marginal halftone dot. Arranging the plurality of halftone pixel clusters with a substantially homogeneous distribution around the marginal halftone dot can comprise locating each halftone pixel cluster of the plurality of halftone pixel clusters at a radial distance from the centre of the marginal halftone dot. Locating each halftone pixel cluster can comprise locating each halftone pixel cluster at substantially the same radial distance. Locating each halftone pixel cluster can comprise locating each halftone pixel cluster substantially along a line segment extending from the centre of the marginal halftone dot to a corner of a halftone cell corresponding to the marginal halftone dot wherein each halftone pixel cluster is located based on a different corner of the halftone cell. Locating each halftone pixel cluster at the radial distance from the centre of the marginal halftone dot can comprise locating based on a characteristic of the marginal halftone dot and the threshold array. Locating based on the characteristic of the marginal halftone dot and the threshold array can comprise: determining a maximum halftone dot area of the marginal halftone dot defined by the threshold array, obtaining data describing a radial distance based on a halftone dot area, and determining the radial distance from the data based on the maximum halftone dot area. The data describing a radial distance based on a halftone dot area can comprises a minimum radial distance for a minimum halftone dot area, and an increased radial distance for a larger halftone dot area. The data describing a radial distance based on a halftone dot area can be specified by a user. Arranging the number of halftone pixels in relation to the marginal halftone dot can comprise: forming a plurality of shared pixel clusters, and arranging the plurality of shared pixel clusters. Forming the plurality of shared pixel clusters can comprise, for each shared pixel cluster, forming the shared pixel cluster for the marginal halftone dot and a plurality of local marginal halftone dots. The plurality of local marginal halftone dots can comprise marginal halftone dots with corresponding halftone cells, with the halftone cells and the halftone cell corresponding to the marginal halftone dot sharing a halftone cell corner location. Arranging the plurality of shared pixel clusters can comprise, for each shared pixel cluster, locating the shared halftone pixel cluster in relation to the marginal halftone dot and the plurality of local marginal halftone dots. Locating the shared halftone pixel cluster can comprise locating the shared halftone pixel cluster substantially equidistant from the marginal halftone dot and the plurality of local marginal halftone dots. Forming the shared pixel cluster can comprise: forming a part of the shared pixel cluster from the number of halftone pixels, and forming a remaining part of the shared pixel cluster based on the plurality of local marginal halftone dots. Forming the part of the shared pixel cluster from the number of halftone pixels can comprise: determining a number of shared halftone pixel clusters, and allocating the number of halftone pixels amongst the number of shared halftone pixel clusters. Determining the number of shared halftone pixel clusters can be based on a halftone geometry of the halftone data. Determining the number of shared halftone pixel clusters can be predetermined to be four shared halftone pixel clusters for a trapezoidal halftone cell geometry. Allocating the number of halftone pixels amongst the number of shared halftone pixel clusters can comprise allocating the number of halftone pixels substantially equally amongst the number of shared halftone pixel clusters.

In a further general aspect, the invention features a method for processing image data to be printed by a relief printing medium onto a substrate, which includes generating halftone data used to produce a relief image in the relief printing medium. The step of wherein generating halftone data comprises identifying a marginal halftone dot amongst the halftone data wherein a relief dot produced in the relief printing medium based on the marginal halftone dot tends to produce a marginally printable relief dot, and enabling a configuration of non-printing halftone pixels in the halftone data, proximate to the marginal halftone dot, to improve the printability of the marginally printable relief dot, wherein the configuration of halftone pixels is based on a characteristic of the marginal halftone dot.

In preferred embodiments, enabling a configuration of halftone pixels in the halftone data can comprise varying the number of enabled pixels as the area of the marginal halftone dot varies. Enabling a configuration of halftone pixels in the halftone data can comprise varying the position of enabled pixels as the area of the marginal halftone dot varies. Enabling the configuration of halftone pixels in the halftone data can comprise enabling a plurality of halftone pixel clusters in relation to the marginal halftone dot. Enabling a configuration of halftone pixels in the halftone data can comprise enabling a part of the configuration of halftone pixels to improve the printability of the marginally printable relief dot and at least one neighboring marginally printable relief dot. The at least one neighboring marginally printable relief dot can comprise a plurality of marginally printable relief dots corresponding to a plurality of marginal halftone dots wherein the marginal halftone dot and the plurality of marginal halftone dots share a halftone cell corner. Generating halftone data can comprise comparing gray scale pixel values derived from the image data with a plurality of threshold arrays. Generating halftone data can comprise selecting a halftone pixel value from one of a plurality of halftone tiles based on a grayscale pixel value derived from the image data, with a halftone tile comprising a plurality of halftone pixel values for an area having a constant grayscale value. Generating halftone data can comprise examining halftone data to identify a marginal halftone dot and modifying the halftone data to enable a configuration of halftone pixels in the halftone data, proximate to the marginal halftone dot. A medium carrying a set of computer-readable signals can comprise instructions which, when executed by a data processor, cause the data processor to execute one of the claimed methods.

In another general aspect, the invention features a relief printing medium that includes a background area corresponding to areas of an image to be printed having no printable image features, an ink-transferring surface defined in relief to the background area and formed in accordance with the halftone data derived from the image to be printed, the ink-transferring surface having a plurality of printable image features including at least one marginally printable image feature corresponding to a marginal halftone dot included in the halftone data, and at least one non ink-transferring raised background area of substantially uniform height disposed proximate to the marginally printable image feature to improve the printability of the marginally printable image feature wherein the raised background area corresponds at least in part to a configuration of halftone pixels enabled in the halftone data proximate to the marginal halftone dot and wherein the configuration of halftone pixels is based on a characteristics of the marginal halftone dot.

In a further general aspect, the invention features a method for producing a relief printing medium that includes establishing a relief medium floor as a base for a relief image and receiving halftone data representing the relief image. The halftone data includes a plurality of normal halftone dots wherein a normal halftone dot tends to produce a reliably printable relief dot, at least one marginal halftone dot wherein a marginal halftone dot tends to produce a marginally printable relief dot, and a configuration of non-printing halftone pixels, proximate to each at least one marginal halftone dot, with the configuration of halftone pixels improving the printability of the corresponding marginally printable relief dot, and with the configuration of halftone pixels is based on a characteristic of the marginal halftone dot, exposing the relief printing medium in accordance with the halftone data, and processing the relief printing medium to develop the relief image. In preferred embodiments, exposing the relief printing medium can comprise exposing with radiation filtered through an image-wise mask or exposing image-wise with focused radiation.

For an understanding of the invention, reference will now be made by way of example to a following detailed description in conjunction by accompanying drawings.

BRIEF DESCRIPTION OF THE DRAWINGS

In drawings which illustrate by way of example only preferred embodiments of the invention:

FIG. 1 is a schematic diagram of a prior art screening method;

FIG. 8A-8F are a series of schematic diagrams of threshold arrays according to one embodiment of the invention.

DESCRIPTION

Figure 2:
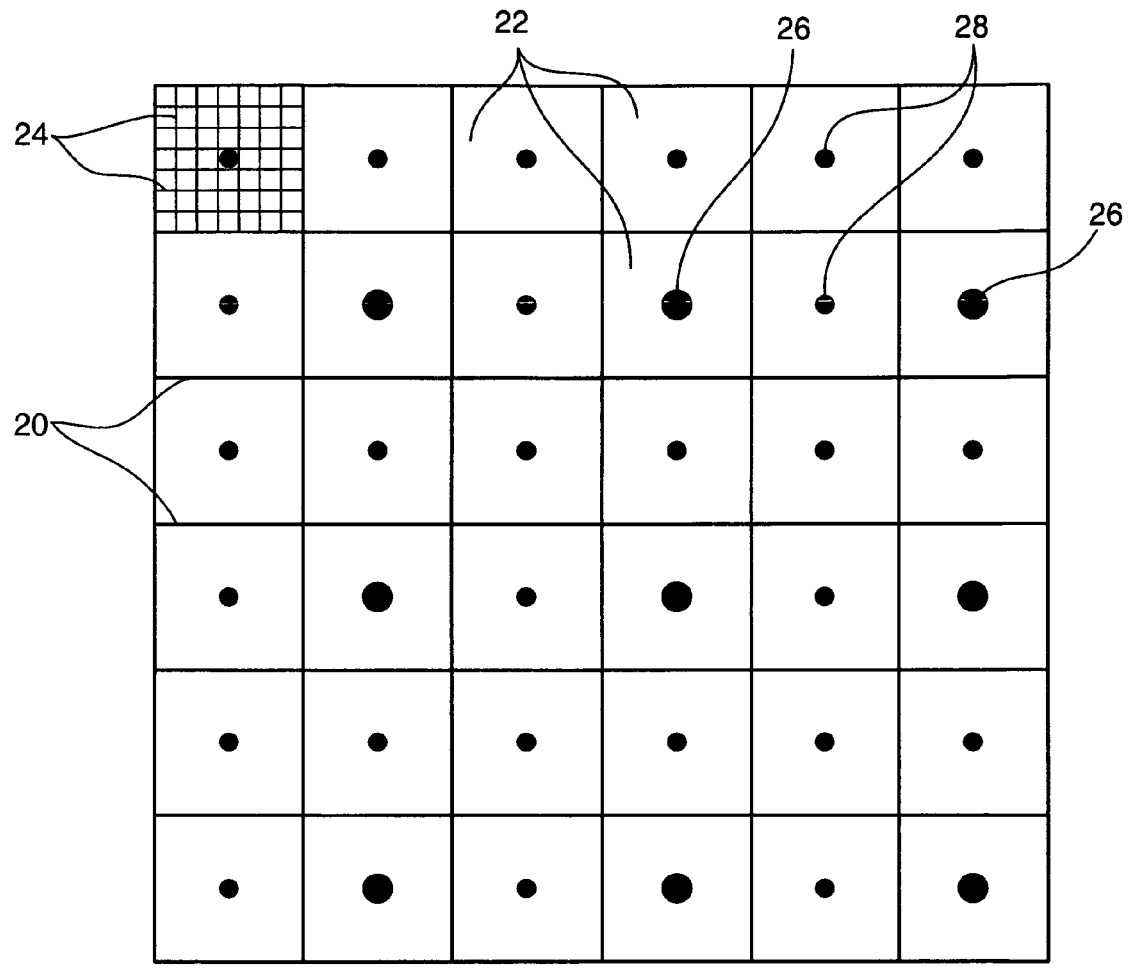
FIG. 2 is a schematic diagram of an embodiment of a screening method in accordance with the present invention.

An embodiment of the invention is shown in FIG. 2. Lines 20 demarcate a plurality of halftone cells 22. It will be readily appreciated that each cell has a plurality of possible locations where the imaging device may place a picture element (pixel) to make up a halftone dot. These locations are shown as grid lines 24 in the upper left hand corner of FIG. 1 (these locations are omitted in the rest of FIG. 2 for sake of clarity). The pixel size is commonly a function of the imaging device configuration and may be fixed or variable. The halftone cell size is a function of the screening engine and is chosen to suit a particular screening job or a category of screening jobs.

A plurality of small halftone dots 26 representing a low density tone or highlight which it is desired to print in the final product are placed at the centres of halftone cells 22. In this case, only one quarter of the halftone cells have printing dots 26. Halftone dots 26 generally comprise a plurality of pixels. While dot 26 is shown having circular shape, in practice the shape will depend on the shape of the pixels and how many pixels are used to make up the dot and the particular spot function chosen. Dot 26 could therefore be irregularly shaped or even square. The size of Dot 26 is such that it may not print without the aforementioned problems. In other words, dot 26 is a marginally printable feature, which may or may not print properly in a subsequent printing operation. The minimum marginally printable dot size may be determined by the printer from knowledge of a particular printing process.

Dots 26 each have neighboring halftone dots 28 which are specifically sized to be nonprinting i.e. when the plate is processed dots 28 are small enough that they will be at least partially removed by the processing solvents. Non-printing dots 28 are spaced apart from the dots 26 by an amount sufficient to ensure that dots 28 and 26 do not join. Consequently, dots 28 after processing do not present a relief area that will take up ink and print. Surprisingly, it was found that non-printing dots 28 surrounding printing dots 26, provides an extra base of support for the dot 26 that appears to prevent the dots 26 from being removed by processing. Furthermore, dots 26 were also prevented from breaking off during printing operations. Through the inclusion of non-printing dots 28 the printer could reliably hold smaller dot sizes on press than was previously possible. An added advantage is that since the dots do not print, but only contribute to the base of the relief, they do not change the printed density of the particular tone that it is desired to represent.

Figure 3:
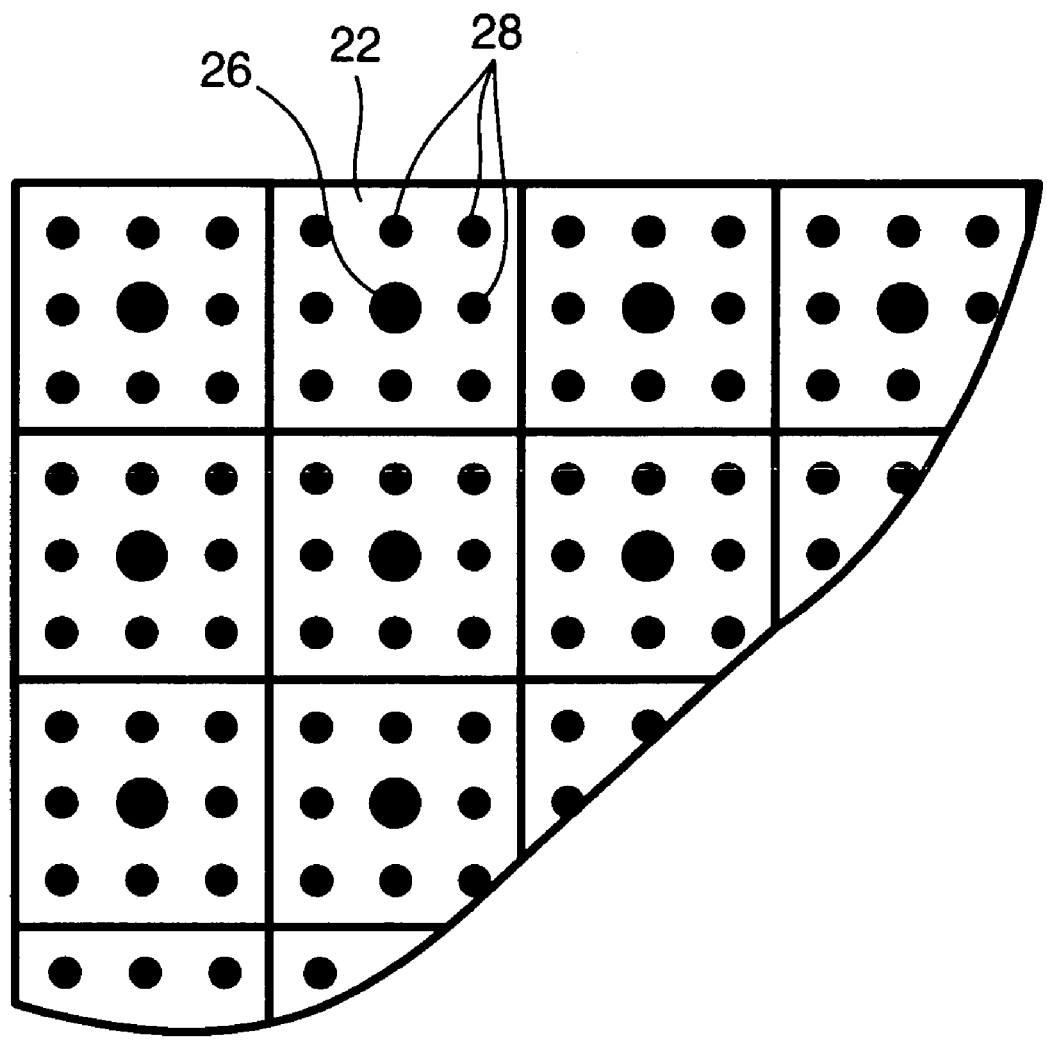
FIG. 3 is a schematic diagram of another embodiment of a screening method in accordance with the present invention.

In another embodiment of the invention, the supporting dots need not necessarily be in adjacent halftone cells. FIG. 3 shows a portion of the screen from FIG. 2 where there are printing halftone dots 26 in every halftone cell and the non-printing halftone dots 28 form a periphery around dots 26 within the same halftone cell.

Figure 4:
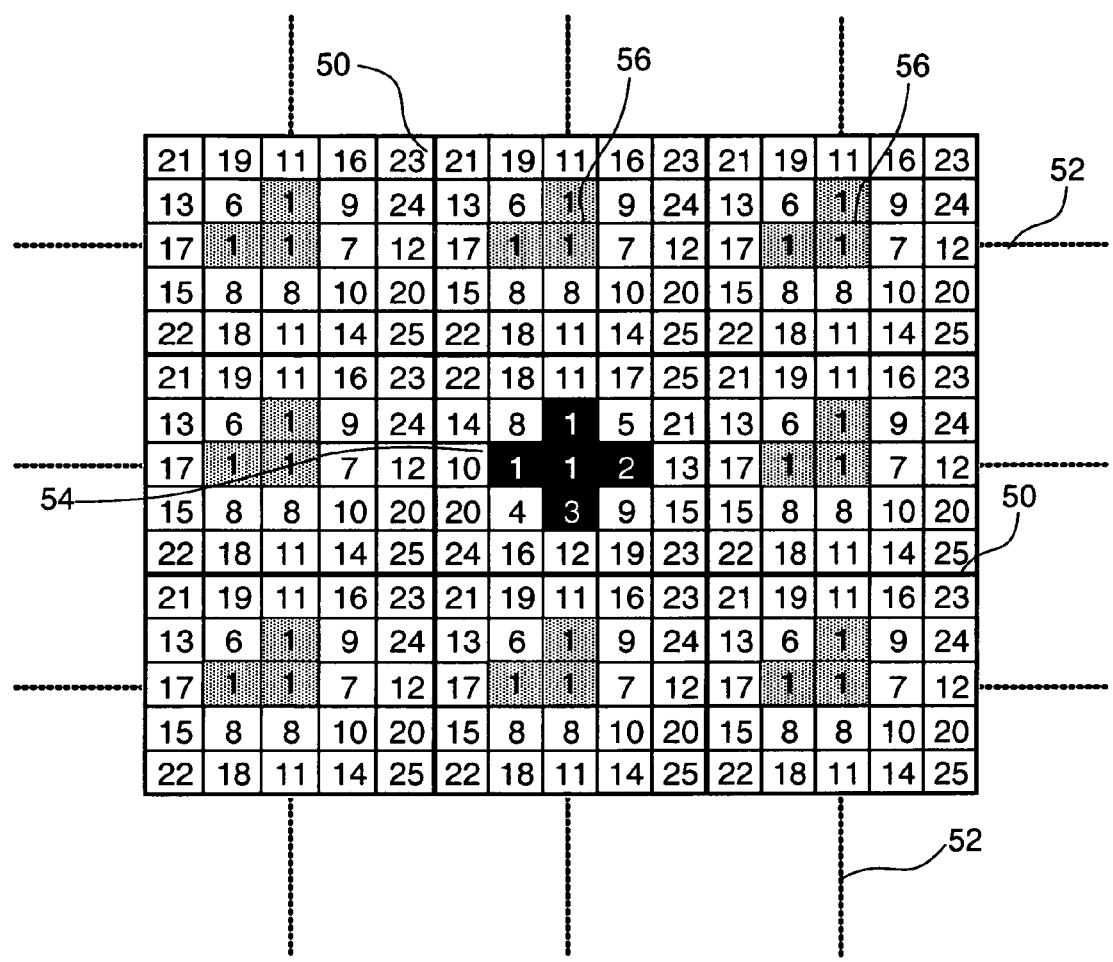
FIG. 4 is a schematic diagram of a threshold array based screening method; 5.

There are several practical screening methods for placing non-printing dots. A preferred embodiment, that is also simple, involves using threshold-array-based AM screening wherein a few central pixels of every halftone dot on the halftone grid are always turned on. The threshold array is compared with the contone image on a pixel-by-pixel basis to build the halftone representation of the contone image. FIG. 4 shows a plurality of halftone dot cells established as indicated by the darkened outlines 50. Each cell has a plurality of locations, in this case 25 locations. The halftone cells are commonly centered on what is known as the screen grid shown as dotted lines 52. The screen grid shown has a screen angle of 0° but it should be understood that the screen grid may also be rotated by some angle to form the screen at commonly used screen angles as is well known in the art. In such a case the halftone cells may not be rectangular in shape but will be defined within the confines of the underlying imaging engine resolution grid. In operation, the threshold matrix as shown is tiled across the plane of the image to cover the entire area thereof. Threshold array screening is well known in the art.

The values at each location determine whether a particular pixel will be on or off, depending on the density of the continuous tone (contone) image at that point. In FIG. 4 the contone image density for the situation and area shown is 3 units (assuming the continuous tone is broken up into 25 levels). Locations in the threshold matrix that have levels less than and equal to 3 will be on. Dot 54 is shown shaded black to indicate that it is on, as it comprises values between 1 and 3. In cells adjacent to the cell containing dot 54, non-printing dots 56 are formed. These dots are below the determined marginally printable dot threshold while dot 54 is on or above that threshold. As the tone density is increased dots 54 will increase in size and dots 56 may also be encompassed in other printing dots in these other regions. Eventually all non-printing dots are obscured by printing dots; the non-printing dots being mainly of use in highlight areas. Once the non-printing dots have disappeared, the screening method returns to conventional AM screening.

The inclusion of non-printing dots has the effect of selectively altering the relief depth in only the areas where such a change is necessary to support marginally printable dots or features. Advantageously areas where the halftone dot size is large enough to print without problem are unaffected.

In another embodiment, threshold array based FM screening may be adapted to include the non-printing dots. An intermediate tone level is chosen in the FM screen where clusters of dots have formed and the clusters are in close proximity to one another. A non-printing dot is placed at the centre of the cluster. The tone level is chosen having regard to the development of random or pseudo-random dots into clusters of dots according to the particular FM screening technique in use. For example, a 30% tone might be convenient since clusters will generally have formed at this stage. This serves to centre a substantial number of the nonprinting dots in the clusters so that as the tone density increases the non-printing dots are mostly overwritten by printing dots, thus rendering them redundant as the density increases.

In another embodiment where it is desired to have more control over the non-printing dots, threshold array screening may be found limiting since it is technically only possible to have the non-printing dot always on, even if they do eventually become encompassed by printing dots. For the situation depicted in FIG. 3 there is no particular problem having all dots 28 on while dot 26 is still small. However, as the tonal density is increased and dot 26 is grown to fill more of the area of halftone cell 22, dot 26 will eventually join with dots 28. When joined to a larger area dot, dots 28' will add to the printing area thus causing undesirable tonal discontinuities. Preferably, dots 28 should be switched off before reaching this point, or as soon as dots 26 no longer need support. Such control over the dots 28 is not easily achievable using threshold arrays but other known screening methods may be employed.

Figure 5:
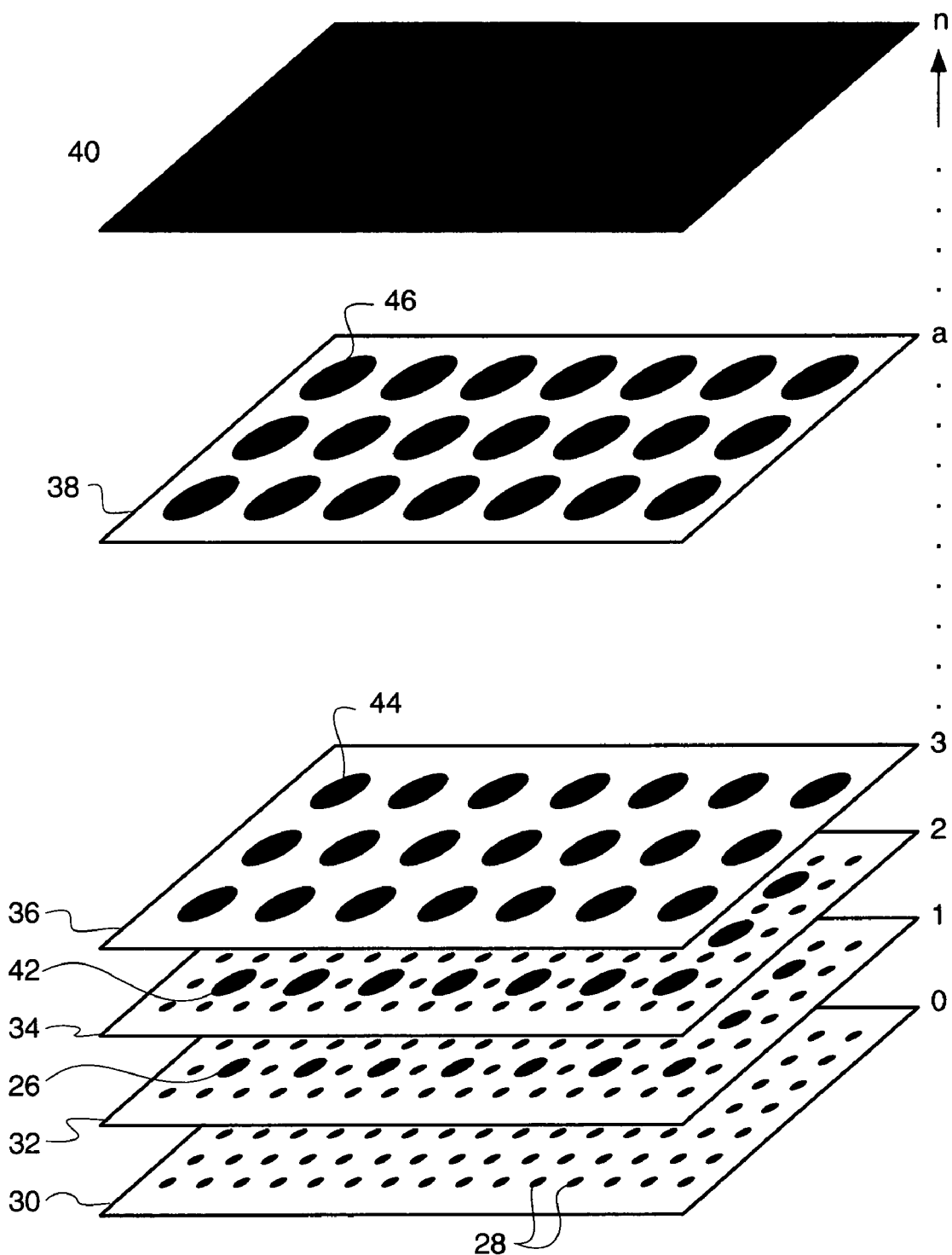
FIG. 5 is a schematic diagram of a tile-based screening method.

One particular method is shown in FIG. 5. A series of tiles 30-36 contain monotonically increasing density screens. Tile 38 is at some intermediate density and tile 40 is a solid. There are n tiles in all corresponding to the desired number of tone levels in the image. It should be appreciated that the tiles in FIG. 5 are not physical objects, but rather manifestations of data structures in a computer device. For example, the set of tiles may be a three dimensional array of values, each individual tile being represented as a two dimensional array in the three dimensional array, there being n such individual tiles in the array. The screening of an image from a contone representation into a halftone representation, involves, for each pixel of the contone image, determining the tone of the pixel and looking up the corresponding tile and applying that tile to the image pixel to achieve the halftone representation.

Tile 30 is the tile that will be used where no-density (0% tone) is desired. This tile has non-printing dots 28 dispersed over the surface. At this tone level, none of the dots 28 will print on the final article. Tile 32 shows the lowest density step where a plurality of small dots 26 have been placed, each being peripherally surrounded by non-printing dots 28.

In tile 34, the dot 42 is the dot 26 from tile 32 that has now been increased in size. Note though that dot 42 is still surrounded by, but not touching non-printing dots 28. In tile 36 dots 44 are again increased in size but now non-printing dots are removed. Dot 44 is large enough not to need support from the non-printing dots—this is now conventional AM screening. An intermediate tile 38 shows dots 46. If dots 28 were still on at this stage, they would be adding to the size of dots 46 causing undesirable increases or jumps in tone level. The final tile 48 is a solid tile wherein all dots have grown into each other to completely cover the area of the tile.

While the embodiment in FIG. 5 has been described in relation to AM screening, it is also adaptable to FM screening wherein each tile has a density represented by an FM screening technique and the non-printing dots are placed in close proximity to (but not adjacent to) small clusters of pixels in the FM screen that are desired to be printed. The size, number, and placement of these non-printing dots are allowed to vary for each tile (i.e. may not place any non-printing dots once all of the clusters in the FM screen have reached a sufficient size). This method has an advantage over the threshold array based approach in that the non-printing dots can be placed closer to the clusters (thus providing more support) while avoiding the potential tone jump caused by printing dots joining with non-printing dots. The advantage of using a tiled screen representation is that the non-printing dots can be confined to a few lower density tiles. This allows the highlights to be treated in isolation without affecting the intermediate and high-density tones.

In yet another embodiment of the invention the image may be conventionally screened without placing any non-printing dots. The screened image is then post processed to add a supporting infrastructure of non-printing halftone dots, in close proximity to any small halftone dots that meet some pre-determined criteria of needing support of non-printing dots. Likewise, the post processing may also identify thin lines or other delicate structure defining marginally printable features that may not print properly. A support infrastructure may be placed around the periphery of lines and other small features in the same way as for dots.

Similarly sub-marginally printable dots may be also be removed from the screened image. By "sub-marginally printable dot" is meant a dot that is smaller than the minimum dot size that is reliably printable even with a supporting infrastructure of non-printing dots. These sub-marginal dots, even with a supporting infrastructure may be susceptible to the problems previously described. It may be advantageous to remove these sub-marginal dots from the image after screening. As an example consider a situation where it is determined that dots of diameter smaller than 50 µm are marginally printable but that dots smaller than 30 µm will still be marginally printable even with the support of non-printing dots. Placing non-printing 20 µm diameter dots around the 30 µm dot may not be sufficient to guarantee that the 30 µm dot will print reliably. In this situation, a step may be added to the process whereby all dots smaller than 30 µm are completely removed form the image. Dots of between 30 and 50 µm diameter will be supported by 20 µm non-printing dots and will print reliably.

EXAMPLE

Figure 6:
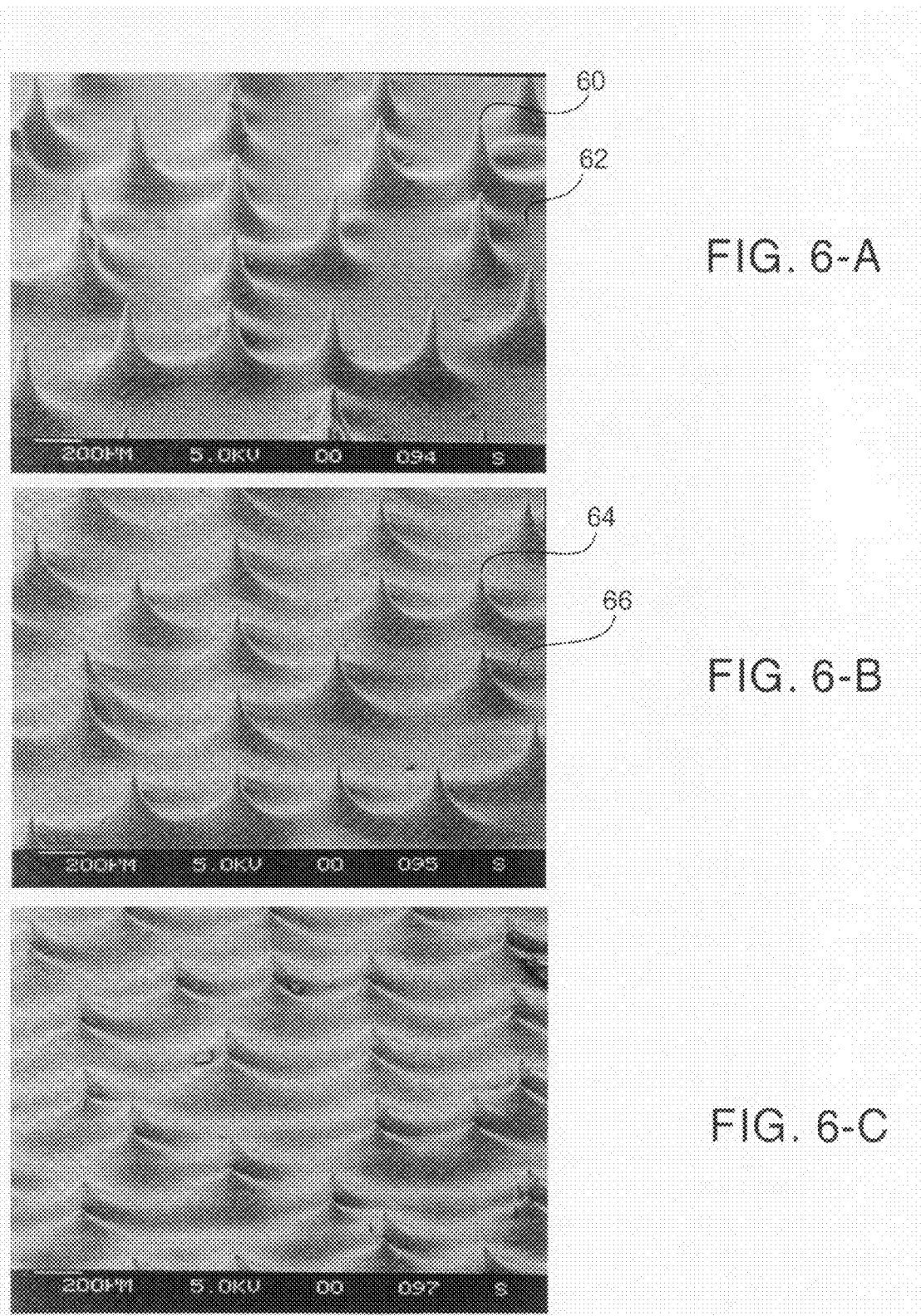
FIG. 6-A-6-C are a series of photographs of flexographic plate samples taken of plates prepared with and without the use of the methods of the present invention.

A test was run using the Creo ThermoFlex imaging engine sold by Creo Inc of Burnaby, BC, Canada to image a flexographic plate. The plate, once imaged was processed according to usual procedures. The plate contained highlight areas with and without the inclusion of nonprinting dots. The photographs shown in FIG. 6-A to 6-C show areas of the plate after processing with a 1% screen @120 lpi. FIG. 6-A shows 1% dots without the support of non-printing dots. Dot 60 has steep shoulders and very little base support. The floor of the flexographic plate shown at 62 is set by a previous back exposure, the level of back exposure chosen for the best overall performance of the plate.

In FIG. 6-B a plurality of 4 pixel non-printing dots have been introduced in the background area of the 1% screen. The floor of the flexographic plate shown at 66 has been effectively raised by the inclusion of these non-printing dots. It should be noted that the shoulders of dot 64 are significantly widened by the inclusion of non-printing dots. It should also be immediately obvious that the inclusion of such dots will reduce the possibility of the small relief features breaking off or folding over. On the other hand, it should also be noted that relief dot 64 has not perceptibly increased in size at the printing relief plane.

In FIG. 6-C the non-printing dots have been increased in size to 6 pixels. The corresponding raising of the relief floor is clearly visible. The relief depth can be selectively varied by varying the size and/or number of non-printing dots.

Figure 7:
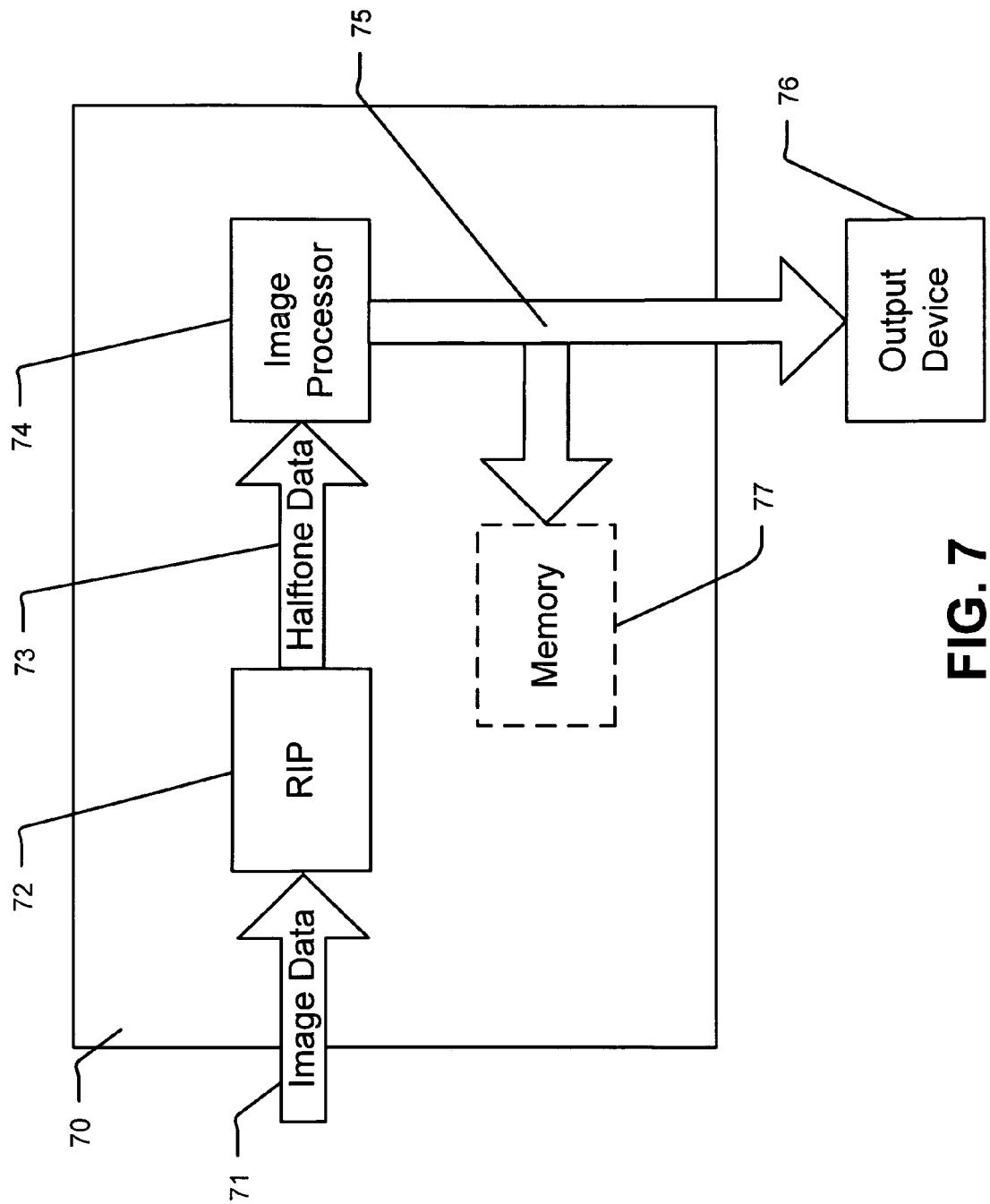
FIG. 7 is a schematic view of an apparatus for carrying out the methods of the present invention.

FIG. 7 shows an apparatus for providing a halftone representation of an image in accordance with the invention. A workstation 70 receives contone image data 71. The workstation may be a general-purpose programmable computer such as a Intel® based PC running a Microsoft Windows® operating system. The contone image data 71 is converted into a raster image by Raster Image Processor (RIP) 72. RIP 72 can employ a plug-in card implementing the rasterising functions in hardware, a stand-alone hardware device, and/or a software module that runs on a suitable general-purpose computer. RIP 72 converts the contone image data 71 into halftone data 73. The halftone data 73 is passed on to an image processor 74. Again, image processor 74 may be implemented in software, hardware or a combination of both. It is well known to employ specialized image processing hardware to speed up image processing functions, but this may no longer be necessary with the advent of extremely fast and low priced general-purpose computers. Image processor 74 scans the halftone data 73 to identify marginally printable features and adds non-printing dots in proximity to the marginally printable features. The resulting halftone data 75 is sent to an output device 83 that prepares the flexographic printing plate in accordance with the halftone data 75. Image processor 74 may process the halftone data 74 on-the-fly, identifying marginally printable features and placing halftone dots while outputting the data 75 to output device 73. Alternatively, workstation 70 may incorporate or allocate memory 77 for storing halftone data 73 prior to outputting it to imaging device 73.

In other preferred embodiments, improvements are provided by methods for adding non-printing halftone pixels in relation to a marginally printable halftone dot. Specifically, halftone pixels are added, by RIP 72 or image processor 74, in varying configurations as the marginally printable halftone dot varies. This improves the printability of the marginally printable halftone dot without unnecessarily raising the relief floor. As previously discussed, methods involving the use of predefined dot profiles (as in the example of FIG. 5) have been described for providing increased control. Additional methods applicable to threshold array embodiments are disclosed in detail here. They may be similarly applied to construction of predefined dot profiles.

FIGS. 8A-8E are a series of schematic diagrams depicting a number of threshold arrays according to a preferred embodiment. Each figure depicts a portion of an exemplary threshold array used for processing gray scale image data from, or derived from, a gray scale image or one separation of a color image. The depicted portion includes a few halftone cells of an amplitude-modulated halftone screen at approximately a forty five degree screen angle. Each threshold array can be used for a predetermined range of gray scale tone values. Some threshold arrays define the location and growth pattern of marginally printable halftone dots as well as the proximate non-printing halftone pixels providing support for it. By using a number of threshold arrays over a range of tone values, the support for marginal halftone dots can be carefully controlled. Through the use of an automatic threshold array construction algorithm, the threshold arrays can be created by image processor 74 or another processor and provided to raster image processor 72 before image data 71 is processed. Preferably, threshold arrays are constructed dynamically in response to a user providing configuration parameters in association with a print job.

Figure 8A:
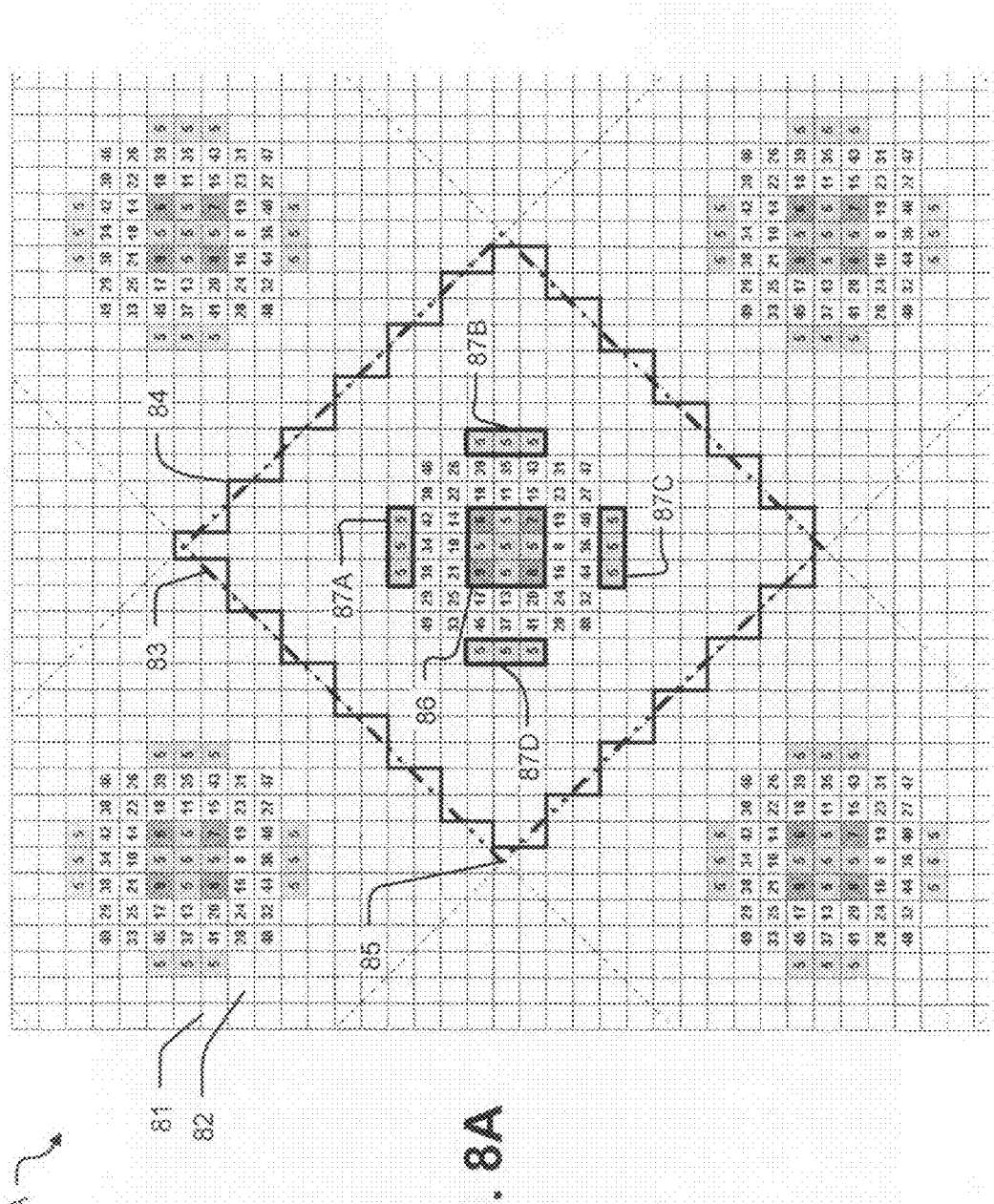

FIG. 8A depicts a portion of an exemplary threshold array corresponding to the lowest range of tone values. The threshold array defines a plurality of halftone pixels 82 formed by a device pixel grid 81. Halftone pixels 82 are organized into a number of similar halftone cells 83. In the examples of FIG. 8, halftone cells 83 are depicted as equivalent. In some embodiments, each halftone cell can be similar but different as described below. Halftone cell 83 is depicted as having four corners 85. Halftone cell 83 includes an integer number of halftone pixels 82 defined by an exemplary actual halftone cell boundary 84. For this example, halftone cell 83 includes two hundred eighty eight halftone pixels 82 representing two hundred eighty nine tone values.

Halftone dot 86, including up to nine halftone pixels 82, is depicted in the middle of halftone cell 83. Threshold values, depicted only for halftone pixels 82 of interest, indicate the image pixel tone value required to enable halftone pixel 82 (e.g. set value to one) in the halftone data sent to the output device. Image tone can be a gray scale value corresponding to a black and white image or can be a gray scale value derived from a channel of a color image. Thus, for image tone values below five, no halftone dot 86 is formed (e.g. halftone pixels 82 set to value of zero). At a constant tone image value of five, halftone dot 86 enables five halftone pixels 82 depicted with light gray shading. As a constant tone image value increases, halftone pixels 82 with thresholds six through nine (e.g. pixels with dark gray shading) are consecutively enabled to form an incrementally larger halftone dot 86.

For the examples of FIG. 8, assume that a halftone dot 86 with a dot area of five pixels is the smallest halftone dot 86 that will produce a relief dot. There is a high probability that a relief dot produced from this size of halftone dot 86 will not print and so it is considered a marginally printable relief dot. Further, assume that a halftone dot 86 comprising twenty five pixels is the largest size that is still considered a marginally printable relief dot (e.g. a smaller but significant probability of being unprintable). To simulate a tone below value five, halftone cells 83 can be assigned different halftone minimum threshold values ranging from one to five (e.g. one fifth use value one) instead of having them all set to the value five. Each can still start to grow at threshold value six as shown.

Marginal halftone dot 86 is shown with four halftone pixel clusters 87A-D in close proximity. Each halftone pixel cluster 87 comprises three halftone pixels 82 located at approximately four pixels from the centre of marginal halftone dot 86. Since there are only three halftone pixels 82 in a cluster, a relief dot is not formed by a halftone pixel cluster 87. Instead, halftone pixel clusters 87 may provide sufficient additional light energy to improve the printability of the relief dot formed by halftone dot 86. As shown, a halftone pixel cluster 87 is enabled as soon as marginal halftone dot 86 is enabled. Halftone pixel clusters 87 remain enabled as marginal halftone dot 86 grows to threshold value nine. In this example, the centre of halftone pixel clusters 87A-D are each located at a fixed distance on a line segment connecting the centre of halftone dot 86 and a halftone cell corner 85.

Other halftone pixel cluster 87 configurations are possible. For example, nine individual halftone pixels could be located with approximately equal spacing on an annulus located approximately 4 pixels from the centre of halftone dot 86. As another example, if halftone cell 83 had a hexagonal geometry, six halftone pixel clusters 87 may be preferred. As another example, fewer or more than nine halftone pixels 82 can be included within halftone pixel clusters 87. As another example, the number of halftone pixels 82 per halftone pixel cluster 87 need not be the same. It is believed that the preferred configuration of halftone pixel clusters 87 depends on halftone dot 86 characteristics (e.g. dot area), relief printing medium characteristics as well as other characteristics (e.g. exposure, developing, and printing). Ideally, the desired configuration of halftone pixel clusters 87 is determined by experimentation and may vary depending on the type of print job or on current process characteristics.

The threshold array of FIG. 8A is thus used for image tone values, or values derived from an image, in the range of zero to nine. The support given by halftone pixel clusters 87A-D is assumed to be suitable for that entire range. Similar to above, the range of suitability for a configuration of halftone pixel clusters 87 is best determined by experimentation. Halftone pixels 82 with larger threshold values (e.g. shown with white shading and values that are blank or greater than nine) are not enabled through the use of this threshold array.

Figure 8B:
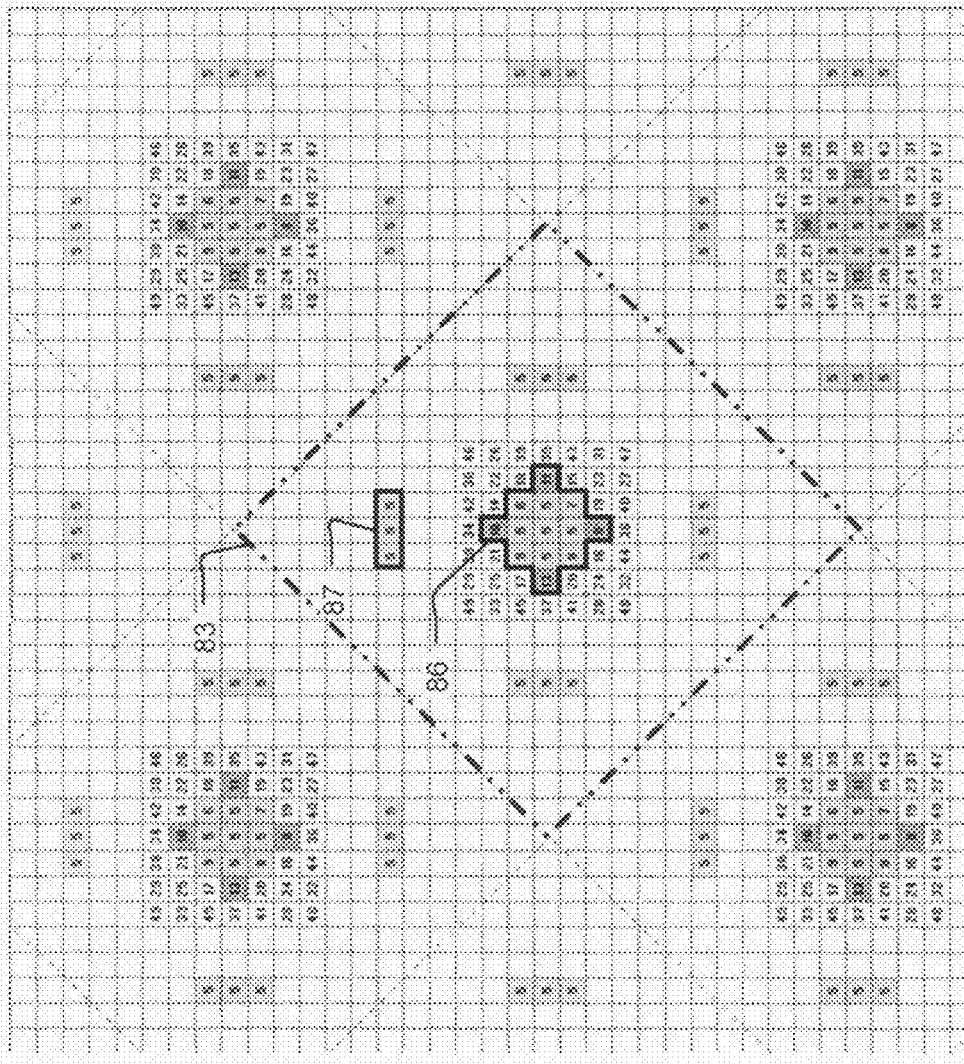
Figure 8C:
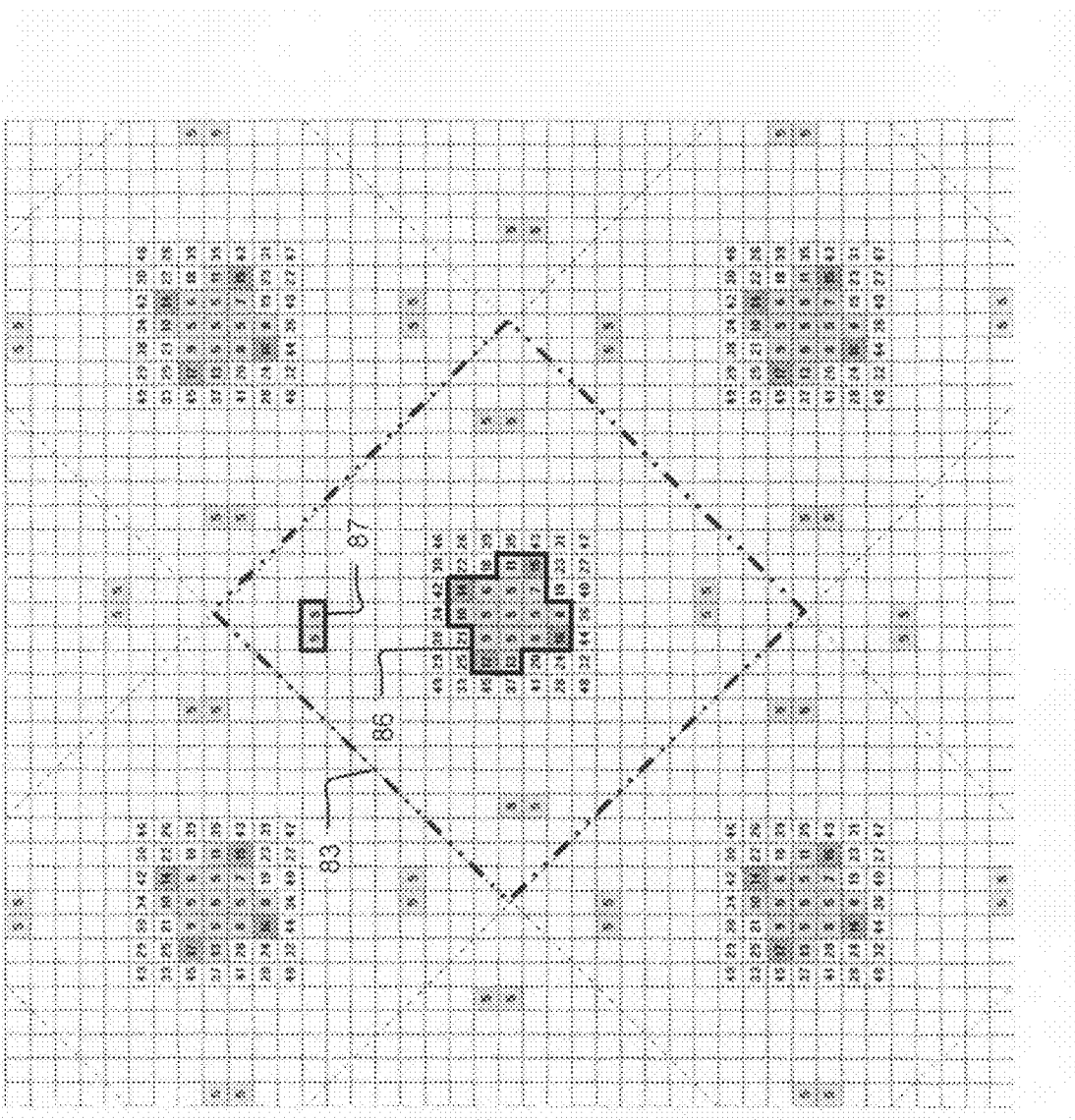
Figure 8D:
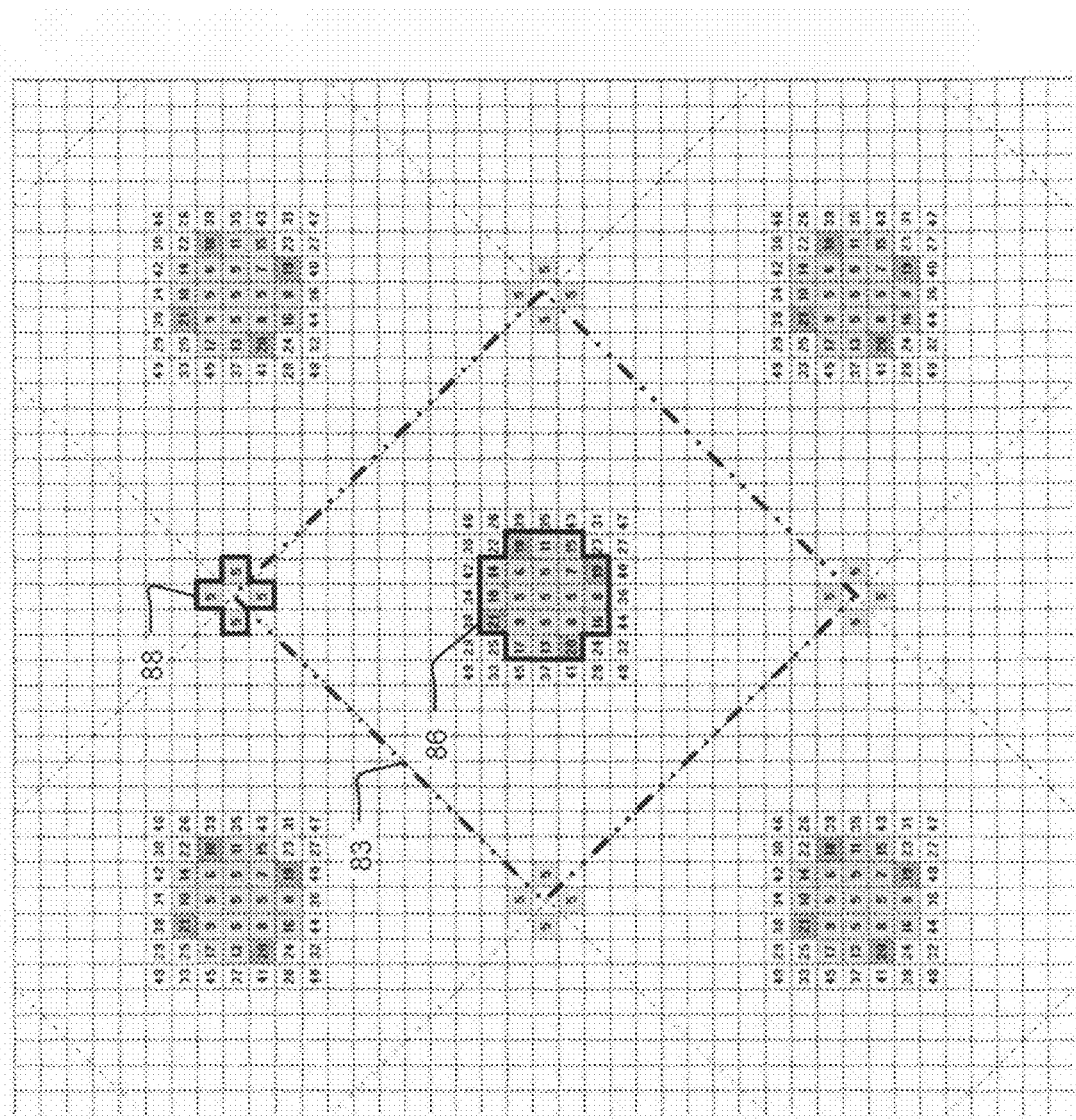

FIGS. 8B-8D depict threshold arrays corresponding to consecutively higher tonal ranges. Each threshold array describes incremental marginal halftone dot 86 growth of four halftone pixels 82. Each figure depicts a different configuration of halftone pixel clusters 87 corresponding to a suitable level of support for the range of marginal halftone dot 86 sizes. In each diagram, halftone pixels 82 that are always enabled are shaded light gray, those that are enabled subject to image tone values are shaded dark gray, and those that are not enabled are shaded white. Some aspects of interest in each figure are described below.

Relative to FIG. 8A, FIG. 8B depicts the same number of halftone pixel clusters 87, including the same number of halftone pixels 82 but at an approximate distance of six pixels from the centre. In this example, as halftone pixel 86 grows, the same degree of support may be required from halftone pixel clusters 87 but it may be preferred to position the support further from the pixel.

FIG. 8C depicts the same number of halftone pixel clusters 87, located further at an approximate distance of eight pixels from the centre and with one less halftone pixel 82 per cluster. In this example, as halftone pixel 86 grows, less support may be required from halftone pixel clusters 87 and it may be preferred to position the support even further from the pixel. As halftone pixel clusters 87 from neighboring halftone cells 83 move further towards halftone cell corner 85 there may be a concern that sufficient light energy is imparted to form a relief dot.

FIG. 8D depicts a strategy for addressing this problem. At some tone range, halftone pixel clusters 87 from neighboring halftone cells 83 begin to form shared halftone pixel clusters 88. In this example, a shared halftone pixel cluster 88 is located approximately at a halftone cell corner 85 with a configuration and a number of halftone pixels 82 that continue to provide support without causing formation of a relief dot. Each of the four neighboring halftone cells 83 in this example contribute one halftone pixel 82 to shared halftone pixel cluster 88. The number of halftone pixels 82 in shared halftone pixel cluster 88 can vary according to the support effect desired so that each halftone cell 83 contributes only a part of a halftone pixel 82 (e.g. three pixels from four cells). In addition, the location and pattern of shared halftone cluster 88 can be varied.

FIG. 8E depicts a threshold array corresponding to the next higher tone range after switching to shared halftone pixel clusters 88. In this example, a final level of support provided by one halftone pixel 82 shared amongst four shared halftone pixel clusters 88 is depicted.

Figure 8F:
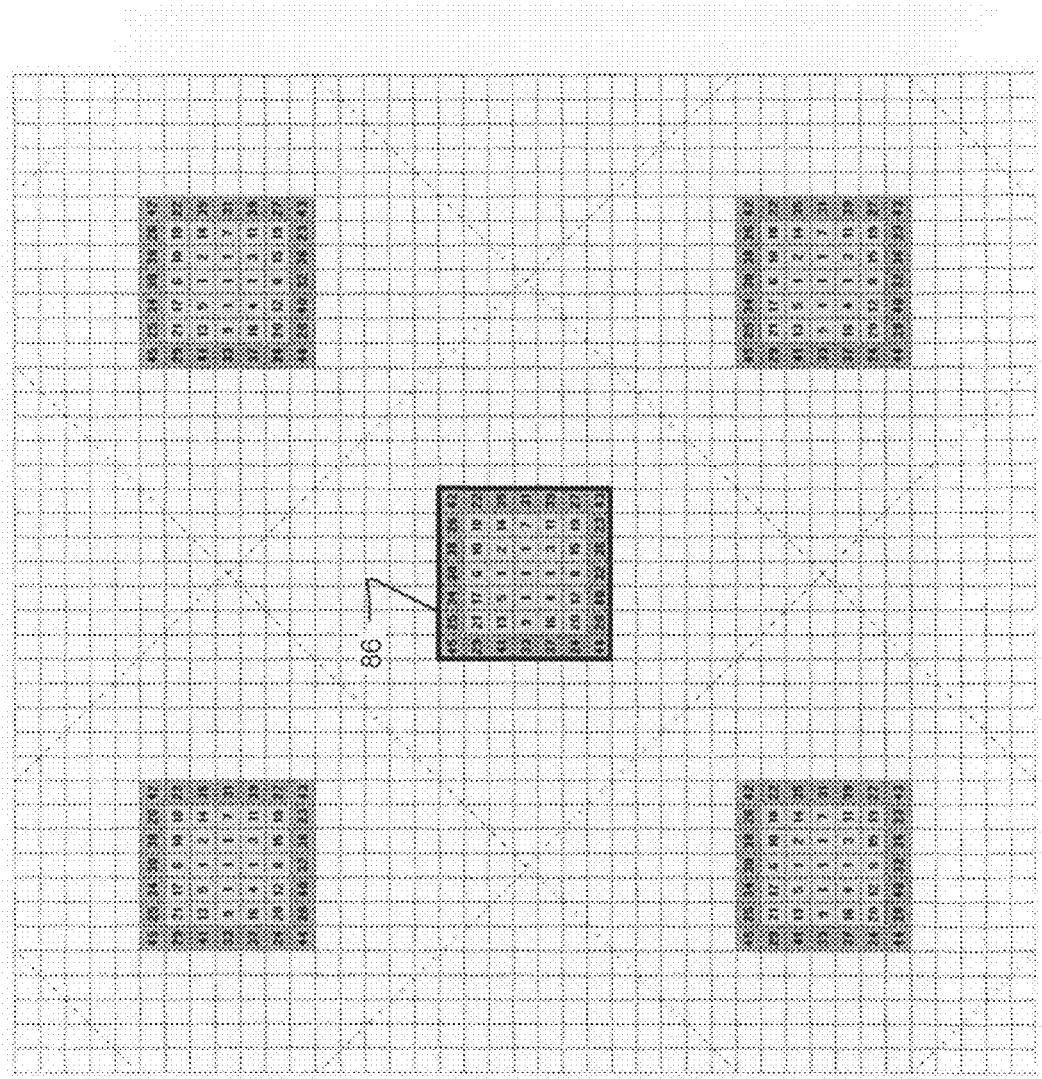

FIG. 8F depicts a final threshold array corresponding to the remaining tonal range. Only halftone dots 86 are defined by this threshold array. Halftone dots 86 defined by this threshold array are assumed to produce reliably printable relief dots. Growth of halftone dot 86 is shown for threshold values up to forty nine. Threshold values from fifty through two hundred eighty eight are omitted for clarity.

It should be clear from the examples of FIGS. 8A-8F that any number of threshold arrays could be used with each having a specific range of halftone dot 86 growth patterns and a unique configuration of halftone pixel clusters 87. However, additional threshold arrays cause a penalty of decreased processing efficiency. In practice, a compromise between efficiency and control can be achieved.

It should also be clear from the examples of FIG. 8A-8F that the method can be applied to a frequency-modulated screening system. In such a system, instead of marginal halftone dots growing as tone values increase, the number of marginal halftone dots grows. Initially, the average spacing between marginal halftone dots can be quite large and thus requiring support. As tone values grow, the average spacing between marginal halftone dots is reduced until support may no longer be required. At each tone value where marginal halftone support is required, a configuration of halftone pixels 82 can be added in relation to a frequency-modulated marginal halftone dot.

In one preferred embodiment, the number of threshold arrays is predetermined to be six. Configuration parameters are provided to a user to control the characteristics of threshold arrays that are automatically constructed from a threshold array pattern corresponding to the reliably printable dot threshold array. Parameters to control the construction can include the following, some of which may be predefined or supplied by a user:

Range Limits—indicating the minimum and maximum tone values that produce marginal halftone dots;

Stagger Halftone Onset—indicating whether to emulate smaller tone values by staggering the onset of minimum sized marginal halftone dots in different halftone cells;

Initial Cluster Size—indicating the initial number of pixels used to construct a cluster;

Initial Cluster Location—indicating an initial radial distance in pixels from dot to cluster centre;

End Cluster Location—indicating a maximum radial distance at which clusters will be formed;

Shared Cluster Onset—indicating a radial distance at which clusters switch to shared cluster configuration;

Cluster Patterns—indicating preferred patterns to form

In this simple embodiment, based on the range limits established, the tonal range for each of the first five threshold arrays is determined by dividing the specified range into approximately equal integer values. Next, the first threshold array is constructed using the final pattern as a template and where halftone dot 86 minimum threshold values are staggered if appropriate. Halftone pixel clusters 87 are dictated by the Initial Cluster Size and Location parameters. A Cluster Pattern can be determined by default (e.g. form a spiral cluster with adjacent pixels centered at Location) or through another means (e.g. configuring an ordered list of preferred patterns or pattern rules). Template threshold values for the halftone pixels 82 defined by halftone pixel clusters 87 are overridden with the minimum threshold value for their corresponding halftone dot 86.

For each successive threshold array, Cluster Location can be interpolated between the Initial and End Cluster Location values. Similarly the Cluster Size can be decremented in a fashion (e.g. linearly by one halftone pixel 82 per halftone pixel cluster 87 per threshold array). When interpolated Cluster Location reaches the Shared Cluster Onset, clusters switch to the shared form. The cluster size for a shared cluster can be derived differently than for a normal cluster if desired. Clearly, many variations are possible including more sophisticated automatic construction schemes. For example, it may be desirable to always use shared clusters and to vary the number of pixels in a shared cluster as marginal halftone dots increase in size.

Certain embodiments of the invention comprise computer processors which execute software instructions which cause processors to perform a method of the invention. For example, workstation 70 may implement a method for processing image data, generating halftone data or modifying halftone data by executing software instructions in a program memory accessible to workstation 70. The invention may also be provided in the form of a program product. The program product may comprise any medium which carries a set of computer-readable signals comprising instructions which, when executed by a computer processor, cause the data processor to execute a method of the invention. Program products according to the invention may be in any of a wide variety of forms. The program product may comprise, for example, physical media such as magnetic data store media including floppy diskettes, hard disk drives, optical data storage media including CD ROMS, DVDs, electronic data storage media including ROMs, flash RAM, or the like or transmission-type media such as digital or analog communication links. The computer readable signals may be compressed or encrypted such that, upon decompression and/or decryption, instructions are made available to a computer processor which can cause the processor to execute a method of the invention.

As will be apparent to those skilled in the art in the light of the foregoing disclosure, many alterations and modifications are possible in the practice of this invention without departing from the spirit or scope thereof.

The invention claimed is:

1. A memory for storing data for access by a flexographic printing system, wherein the memory comprises machine-readable data elements adapted to specify to the flexographic printing system at least one marginally printable image feature, at least one non-printing feature proximate the marginally printable image feature, and at least one non ink-transferring background area.

2. The memory of claim 1 wherein the machine-readable data elements include data elements operative to specify the at least one non-printing feature as one or more non-printing dots.

3. The memory of claim 1 wherein the data elements include threshold values suitable for the flexographic printing system to compare with image data to produced halftone data in a halftoning process.

4. The memory of claim 3 wherein the data elements adapted to specify the marginally printable image feature include a first plurality of threshold values having a spatial arrangement and a maximum value.

5. The memory of claim 4 wherein the halftoning process applied to constant image data up to the maximum value produces a marginally printable halftone dot based on the first plurality of threshold values.

6. The memory of claim 4 wherein the data elements adapted to specify the at least one non-printing feature include at least one threshold value having a spatial arrangement proximate the first plurality of threshold values and wherein the at least one threshold value is not greater than the maximum value of the first plurality of threshold values.

7. The memory of claim 6 wherein the halftoning process applied to constant image data up to the maximum value produces at least one non-printing enabled halftone pixel in the halftone image data to increase the printability of the marginally printable halftone dot.

8. The memory of claim 6 wherein the data elements adapted to specify the at least one non ink-transferring background area include a second plurality of threshold values with a spatial arrangement disjoint from the first plurality of threshold values and the at least one threshold value and wherein the second plurality of threshold values have a minimum value that exceeds the maximum value of the first plurality of threshold values.

9. The memory of claim 3 wherein the threshold values are spatially arranged in a threshold array.

10. The memory of claim 9 including a plurality of threshold arrays wherein each threshold array is intended for use with a different range of image data values.

11. The memory of claim 1 wherein the data elements include a plurality of halftone dot profiles for a plurality of grey scale values wherein a halftone dot profile includes a spatial arrangement of halftone pixel values to represent an area of constant image data of a corresponding grey scale value.

12. The memory of claim 11 wherein at least one dot profile includes a marginal halftone dot and at least one non-printing enabled halftone pixel proximate the marginal halftone dot.

13. The memory of claim 1 wherein the data elements include information for identifying a marginally printable halftone image feature amongst halftone image data.

14. The memory of claim 13 wherein the information for identifying the marginally printable halftone image feature comprises a feature area threshold wherein halftone image features with an area below the threshold are identified as marginally printable.

15. The memory of claim 13 wherein the data elements include information for establishing a non-printing halftone feature proximate the marginally printable halftone image feature.

16. The memory of claim 15 wherein the information for establishing the non-printing halftone feature comprises a predefined arrangement of halftone pixels to be enabled proximate the marginally printable halftone image feature.

17. The memory of claim 15 wherein the information for establishing the non-printing halftone feature comprises at least one rule for determining an arrangement of halftone pixels to be enabled proximate the marginally printable halftone image feature.

18. A memory for storing data for access by a relief printing system, wherein the memory comprises machine-readable data elements adapted to specify to the relief printing system:

a marginal halftone dot wherein the marginal halftone dot tends to produce a marginally printable relief dot in a relief printing plate; and a configuration of non-printing enabled halftone pixels, proximate to the marginal halftone dot, to improve the printability of the marginally printable relief dot and wherein the configuration of halftone pixels is based on a characteristic of the marginal halftone dot.

19. A memory according to claim 18 wherein the data elements comprise first data elements for specifying a first configuration of halftone pixels for a first marginal halftone dot of a first area and second data elements for specifying a second configuration of halftone pixels for a second marginal halftone dot of a second area and wherein the number of pixels of a configuration of non-printing enabled halftone pixels is different amongst the first and second data elements.

20. A memory according to claim 19 wherein the position of pixels of a configuration of non-printing enabled halftone pixels is different amongst the first and second data elements.

21. A memory according to claim 18 wherein the configuration of non-printing halftone pixels specified by the data elements comprise a plurality of halftone pixel clusters in relation to the marginal halftone dot.

22. A memory according to claim 18 wherein the configuration of non-printing halftone pixels specified by the data elements are designed to also improve the printability of at least one neighboring marginally printable relief dot.

23. A memory according to claim 18 wherein the configuration of non-printing halftone pixels specified by the data elements comprise a halftone pixel cluster in relation to the marginal halftone dot and at least one neighboring marginally printable halftone dot.

* * * * *